US010008522B2

(12) United States Patent
Hu

(10) Patent No.: US 10,008,522 B2
(45) Date of Patent: Jun. 26, 2018

(54) MULTI-SPECTRUM PHOTOSENSITIVE DEVICE AND MANUFACTURING METHOD THEREOF

(75) Inventor: Xiaoping Hu, Shenzhen (CN)

(73) Assignee: Boly Media Communications (Shenzen) Co., Ltd., Shenzhen (CN)

(*) Notice: Subject to any disclaimer, the term of this patent is extended or adjusted under 35 U.S.C. 154(b) by 916 days.

(21) Appl. No.: 13/699,558

(22) PCT Filed: Jun. 1, 2010

(86) PCT No.: PCT/CN2010/073441
§ 371 (c)(1),
(2), (4) Date: Nov. 21, 2012

(87) PCT Pub. No.: WO2011/150552
PCT Pub. Date: Dec. 8, 2011

(65) Prior Publication Data
US 2013/0062512 A1 Mar. 14, 2013

(51) Int. Cl.
*H01L 27/146* (2006.01)

(52) U.S. Cl.
CPC .. *H01L 27/14601* (2013.01); *H01L 27/14621* (2013.01); *H01L 27/14647* (2013.01); *H04N 2209/047* (2013.01); *Y10T 29/49002* (2015.01)

(58) Field of Classification Search
CPC ......... H01L 27/14601; H01L 27/14647; H01L 27/14621; G01J 3/50; B23P 17/00
(Continued)

(56) References Cited

U.S. PATENT DOCUMENTS 4,514,755 A 4/1985 Tabei
5,696,371 A * 12/1997 Meyers ................ G02B 3/0043 250/208.1
(Continued)

FOREIGN PATENT DOCUMENTS

CN 101345248 A 1/2009
CN 100563018 C 11/2009
(Continued)

OTHER PUBLICATIONS

International Search Report dated Dec. 16, 2010 in corresponding Application No. PCT/CN2010/073441.

*Primary Examiner* — Kevin Pyo
*Assistant Examiner* — Don Williams
(74) *Attorney, Agent, or Firm* — Knobbe, Martens, Olson & Bear, LLP

(57) ABSTRACT

The present disclosure relates to a multi-spectrum photosensitive device and manufacturing method thereof. The multi-spectrum photosensitive device comprises at least one opaque base layer; each base layer having at least two sides, at least two of the sides are provided with photosensitive pixel groups, each photosensitive pixel group is used for sensing light of either spectrum irradiated from the obverse direction of the located side. Alternatively, the multi-spectrum photosensitive device comprises at least one transparent base layer; each base layer having at least two sides, at least two of the sides are provided with photosensitive pixel groups, each photosensitive pixel group is used for sensing light of interested spectrum irritated from the obverse direction or reverse direction of the located side. The present invention could be used to simultaneously sense different views of two directions or to sense a view of one direction by using the same sensing device to carry out double-
(Continued)

direction sensing, thereby improving the performance of sensing device.

11 Claims, 33 Drawing Sheets

(58) Field of Classification Search
USPC .......... 250/226, 208.1; 348/33–35, 273, 274, 348/275, 374
See application file for complete search history.

(56) References Cited

U.S. PATENT DOCUMENTS

| | | | | |
|---|---|---|---|---|
| 5,754,898 | A * | 5/1998 | Nakano | 396/180 |
| 5,917,621 | A * | 6/1999 | Yushiya | H04N 1/486 250/208.1 |
| 6,150,708 | A | 11/2000 | Gardner et al. | |
| 6,740,807 | B2 * | 5/2004 | Ono | H01G 9/2009 136/255 |
| 7,129,466 | B2 | 10/2006 | Iwasaki | |
| 7,619,683 | B2 | 11/2009 | Davis | |
| 8,477,223 | B2 * | 7/2013 | Itonaga | 348/273 |
| 8,878,969 | B2 * | 11/2014 | Holscher et al. | 348/273 |
| 2005/0045808 | A1 | 3/2005 | Yonezawa et al. | |
| 2006/0192262 | A1 * | 8/2006 | Kikuchi | H01L 27/14603 257/443 |
| 2008/0068478 | A1 | 3/2008 | Watanabe | |
| 2011/0181763 | A1 | 7/2011 | Hiramoto et al. | |
| 2013/0063641 | A1 * | 3/2013 | Venezia | H01L 27/14627 348/308 |

FOREIGN PATENT DOCUMENTS

| | | | |
|---|---|---|---|
| CN | 101740587 | A | 6/2010 |
| JP | 1990-177474 | A | 7/1990 |
| JP | 4-290464 | A | 10/1992 |
| JP | 2006-005762 | A | 1/2006 |
| JP | 2008-072423 | A | 3/2008 |
| JP | 2008-172258 | A | 7/2008 |
| JP | 2008-245217 | A | 10/2008 |
| JP | 2010-527677 | A | 8/2010 |
| WO | 2011/043025 | A1 | 4/2011 |

* cited by examiner

| | | | | | | | | | | | |
|---|---|---|---|---|---|---|---|---|---|---|---|
| C | Y | C | Y | C | Y | | | | | | |
| M | G | M | G | M | G | | | | | | |
| C | Y | C | Y | C | Y | | | | | | |
| M | G | M | G | M | G | | | | | | |
| C | Y | C | Y | C | Y | | | | | | |
| M | G | M | G | M | G | | | | | | |
| | | | | | | | | | | | |
| | | | | | | | | | | | |
| | | | | | | | | | | | |
| | | | | | | | | | | | |
| | | | | | | | | | | | |
| | | | | | | | | | | | |

Fig 1

| G | R | G | R |   |   |
|---|---|---|---|---|---|
| B | G | B | G |   |   |
| G | R | G | R |   |   |
| B | G | B | G |   |   |
|   |   |   |   |   |   |
|   |   |   |   |   |   |

| G | B | G | B |   |   |
|---|---|---|---|---|---|
| R | G | R | G |   |   |
| G | B | G | B |   |   |
| R | G | R | G |   |   |
|   |   |   |   |   |   |
|   |   |   |   |   |   |

| B | G | B | G |   |   |
|---|---|---|---|---|---|
| G | R | G | R |   |   |
| B | G | B | G |   |   |
| G | R | G | R |   |   |
|   |   |   |   |   |   |
|   |   |   |   |   |   |

| R | G | R | G |   |   |
|---|---|---|---|---|---|
| G | B | G | B |   |   |
| R | G | R | G |   |   |
| G | B | G | B |   |   |
|   |   |   |   |   |   |
|   |   |   |   |   |   |

| C | B | B | C |
|---|---|---|---|
| G | C | C | G |
| C | B | B | C |
| G | C | C | G |
| C | B | B | C |
| G | C | C | G |
| C | B | B | C |
| G | C | C | G |

obverse

| R | R | R | R |
|---|---|---|---|
| R | R | R | R |
| R | R | R | R |
| R | R | R | R |
| R | R | R | R |
| R | R | R | R |
| R | R | R | R |
| R | R | R | R |

reverse

| Y | R | R | Y |
|---|---|---|---|
| G | Y | Y | G |
| Y | R | R | Y |
| G | Y | Y | G |
| Y | R | R | Y |
| G | Y | Y | G |
| Y | R | R | Y |
| G | Y | Y | G |

obverse

| B | B | B | B |
|---|---|---|---|
| B | B | B | B |
| B | B | B | B |
| B | B | B | B |
| B | B | B | B |
| B | B | B | B |
| B | B | B | B |
| B | B | B | B |

reverse obverse reverse obverse reverse obverse reverse obverse reverse

MULTI-SPECTRUM PHOTOSENSITIVE DEVICE AND MANUFACTURING METHOD THEREOF

This application is the U.S. National Phase under 35. U.S.C. § 371 of International Application PCT/CN2010/073441, filed Jun. 1, 2010, which is hereby incorporated by reference in their entirety. The International Application was published under PCT Article 21(2) in a language other than English.

TECHNICAL FIELD

The present disclosure relates to a multi-spectrum photosensitive device and manufacturing method thereof. More particularly, the present disclosure relates to a panchromatic photosensitive device which may sense a plurality of spectrums (such as visible light and infrared) simultaneously, and manufacturing method thereof. Herein, the panchromatic spectrum (or color) comprises the entire spectra of interest. For normal photosensitive devices (e.g., those for visible light), the panchromatic comprises the entire spectra of visible light that contains red, green, blue and white. For photosensitive devices used for a combination of infrared and visible light, the panchromatic comprises spectra of the visible light and infrared. The present disclosure applies to a multi-spectrum photosensitive device containing for sensing monochrome and color images.

BACKGROUND ART

The traditional technology for designing and manufacturing color image photosensitive chips (or devices) takes the use of either single-layer photosensitive pixel, or three-layer photosensitive pixel. For a photosensitive chip using the single-layer photosensitive pixel, in order to obtain color images, it must be coated with a filter in accordance with a certain pattern, such as Bayer Pattern or honeycomb pattern. For a photosensitive chip using the three-layer sensing pixel, there is no need to use color filter. Those conventional technologies for designing and manufacturing color image photosensitive chips (or devices) are still yet to be improved.

In the traditional single-layer color image photosensitive chip, two different kinds of patterns are mainly used for obtaining color signal. FIG. 1 is the first kind of color filter pattern, namely a CYMG pattern (also called composite color filter pattern), which consists of cyan, yellow, magenta and green color. FIG. 2 and FIGS. 3(*a*), 3(*b*) are several primary color (RGB) filter patterns ordered as a Bayer Pattern or Honeycomb Pattern, respectively. Both of these two patterns consist of red, green and blue color.

In the color photosensitive chip made of CYMG pattern, the photosensitive pixel array comprises many macro-pixels. Each macro-pixel is composed of four pixels, each being coated by C, Y, M, G color filter respectively. However, the display industry uses the three primary colors (i.e. RGB) pattern rather than CYMG pattern, thus it is necessary to transform a color matrix for C, Y, M or G color to a matrix for RGB so as to convert CYMG pattern into RGB pattern. Moreover, because each pixel point senses only one color (either cyan, or yellow, or magenta, or green), to sense RGB colors by each pixel, interpolation is needed to interpolate the missed colors from the adjacent pixel points. In the color photosensitive chip of Bayer Pattern (U.S. Pat. No. 3,971,065), the photosensitive pixel array comprises many macro-pixels, each comprising four pixels coated with only RGB colors. Bayer Pattern further requires that in every macro-pixel, two elements on one of the diagonals must sense green or a color corresponding to luminance of the image, whereas the other two colors sensed are red and blue, or colors corresponding to two other different spectra of visible light. Similarly, since each pixel point senses only one color (red, or green, or blue), interpolation is needed to interpolate the missed colors from the adjacent pixel points for obtaining the other two missed colors at each point. Bayer Pattern has four different orderings, each representing a specific arrangement of the RGB position. In a honeycomb pattern as shown in FIG. 3, a macro-pixel comprises only three pixels coated by RGB colors and arranged in a hexagonal honeycomb shape. In the honeycomb pattern, pixels sensing RGB colors are arranged uniformly and symmetrically; and exchanging the positions of two pixels still yields a honeycomb pattern.

As described above, there are three common issues in implementing the color filter formed by a composite color (CYMG) pattern, Bayer Pattern, or honeycomb pattern: firstly reducing sensitivity due to the existence of the color filtering film (compared with the monochrome photosensitive chip); secondly reducing effective spatial definition (or resolution) due to color interpolation, which in return causes the third one, color aliasing. Normally, the color aliasing may be solved by using low-pass filters. However, low-pass filters will reduce the image definition, thereby worsening the second issue.

In order to avoid the reduction of sensitivity caused by the color filter and to enhance the overall photosensitivity, U.S. Pat. No. 6,137,100 discloses a method of balancing the sensing response of RGB photosensitive pixels, which makes use of the characteristic of photodiodes that have different sensitivities for different colors. Particularly, a photodiode is more sensitive to green, secondly red, and then blue. Therefore, areas sensitive to blue are made biggest, then to red and smallest to green. The improvement on color sensitivity with this method is still limited. Moreover this method just emphasizes the RGB color pattern.

Color photosensitive devices generally sense the continuous spectrum corresponding to RGB color. There are also monochrome image photosensitive devices that are sensitive to the entire visible spectrum, or the infrared spectrum, or both of them. The sensitivity of such a kind of monochrome photosensitive device is generally 10 times more than that of the traditional color photosensitive device of Bayer pattern (under the same physical condition of production), but such a device cannot produce color.

In a patent application titled “Multi-spectrum photosensitive device and manufacturing method thereof” (PCT/CN2007/071262) applied by the present inventor earlier, a photosensitive chip using two-layer photosensitive pixels is provided. According to this new method, the spectrum of top layer and bottom layer are layered in orthogonal or complementary form, as shown in FIG. 4 and FIG. 5, so that at any pixel positions, photosensitive pixels on top layer and bottom layer can respectively sense orthogonal or complementary spectrum (either the visible spectrum, or the spectrum of visible light and infrared), thereby maximizing the use of incident light energy. This method can be implemented by either using color filters or not, and also considering the advantages of spatial resolution ratio, color reduction, and photosensitivity. However, this new method did not optimize the design of physical structure of top layer and bottom layer.

The traditional technology for designing and manufacturing color image photosensitive chip (or device) has another characteristic, that is, sensing at the front side or the back side of the chip normally (such as U.S. Pat. No. 4,388,532, U.S. Pat. No. 4,679,068, U.S. Pat. No. 5,244,817, U.S. Pat. No. 6,169,369, U.S. Pat. No. 6,429,036, and U.S. Pat. No. 7,265,397). The U.S. Pat. No. 5,134,274] and U.S. Pat. No. 6,191,404 are mentionable for providing a two-sided photosensitive chip (and system) which can sense at both front side and backside simultaneously. The term "front side" means the side facing to the light source on the base layer of the chip, accordingly, the term "front side sensing" means sensing by photosensitive pixels at the front side; whereas term "back side" means the side back to the light source on the base layer of the chip, accordingly, the term "back side sensing" means sensing by photosensitive pixels at the back side. The back side sensing requires that the base layer of the chip is thin enough and may be sealed specifically so that light can penetrate through the base layer and be sensed by photosensitive pixels. Such a two-sided photosensitive chip is enabled to receive light from front side and back side simultaneously, thus having the characteristic of integrating signals of two different light sources. However such a kind of two-sided photosensitive chip merely contains one layer of photosensitive pixels located on a certain side of the base layer of the chip. Consequently, when a user needs to obtain color (or multi-spectrum) sensing signal, or to receive two different views (or contents) on a photosensitive chip, this kind of single-layer photosensitive chip which is enabled to sense at two sides encounters difficulty. In addition, the single-layer photosensitive chip which is enabled to sense at two sides requires of light signals from two directions, obverse and reverse, which has corresponding relation on the geometrical space, that is to say it can merely be used for single view.

Therefore, those prior arts of photosensitive chips still have disadvantages. As for single-layer photosensitive chip, bottleneck occurs on the aspect of sensitivity, and the utilization efficiency of space and energy thereof is no better than that of the multi-layered. And as for multi-layer (double-layer or three-layer) photosensitive chip, the process is more complex and difficult. Another function which no prior arts of photosensitive chip have is that, they cannot sense the light corresponding to different views from two directions, obverse and reverse.

Thus, it is still necessary to improve the prior arts to find out a sensing device and a manufacturing method thereof, which may combine the advantages of the monochrome image sensing device and color image sensing device, and can sense light from two different directions simultaneously or asynchronously for further enhancing the performance of sensing chip and extending the functions of single chip.

SUMMARY

Technical Problem

To overcome the limitations and difficulties confronted by the above prior arts, the object of the present disclosure is to provide a multi-spectrum photosensitive device and manufacturing method thereof, which may obtain views from different directions simultaneously.

Technical Solution

In order to facilitate describing the present disclosure and explain differences from the prior arts, herein the definitions of the following terms will be given: double-layer sensing device, double-sided sensing device, and double-direction sensing device. A double-layer sensing device mean that the photosensitive pixels thereof are physically divided into two layers (as the double-layer sensing device described in a patent application titled "multiple-spectrum photosensitive device and manufacturing method thereof" (PCT/CN2007/071262) applied by the present inventor earlier), each having sensing pixels for sensing specific spectrum. A double-sided sensing device refers to a photosensitive device having two sensing surfaces, with each surface being able to sense from at least one direction. A double-direction sensing device refers to a sensing device which is able to sense from two directions (which generally form an angle of 180 degree), that is, both the front side and back side of the sensing device can sense light.

A photosensitive device may simultaneously have one, two or all of those three characteristics: double-layer, double-sided and double-direction. The present disclosure mainly relates to a double-sided double-layer sensing device (as shown in FIGS. 6(*a*)-(*c*)), a double-direction sensing device (such as the U.S. Pat. No. 5,134,274 and U.S. Pat. No. 6,191,404]), a double-sided double-direction sensing device (as shown in FIGS. 6(*a*)-(*c*) and FIG. 16) and a double-sided double-layer double-direction sensing device (as shown in FIGS. 9(*a*)-(*c*)).

The technical solution according to the present disclosure is:

A multi-spectrum photosensitive device, comprising at least one opaque base layer; wherein each base layer comprises at least two sides, at least two of the sides are provided with photosensitive pixel groups, each of the photosensitive pixel groups is used for sensing light of interested spectrum irradiated from the obverse direction of the side the photosensitive pixel group located on.

In the multi-spectrum photosensitive device, there is one base layer provided with two sensing sides, which respectively comprise photosensitive pixels distributed same or differently for sensing various spectrums.

The interested spectrum comprises one or more spectrums of blue, green, red, cyan, yellow, white, infrared, red plus infrared, yellow plus infrared, and white plus infrared.

In the multi-spectrum photosensitive device, a set of lens is installed respectively in front of each side on the base layer.

A method of manufacturing the above-mentioned multi-spectrum photosensitive device, comprising:

- providing at least one opaque base layer, wherein each base layer comprises at least two sides;
- at least two of the sides of the base layer are provided with photosensitive pixel groups, each photosensitive pixel group is used for sensing light of interested spectrum irradiated from the obverse direction of the side the photosensitive pixel group located on.

Another kind of multi-spectrum photosensitive device, comprising at least one transparent base layer; each base layer comprises at least two sides, at least two of the sides are provided with photosensitive pixel groups, each photosensitive pixel group is used for sensing light of interested spectrum irradiated from the obverse direction or reverse direction of the side the photosensitive pixel group located on.

In the multi-spectrum photosensitive device, there is one base layer provided with two sensing sides, each of which respectively has photosensitive pixels distributed the same or differently for sensing various spectrums.

The interested spectrum comprises one or more spectrums of blue, green, red, cyan, yellow, white, infrared, red plus infrared, yellow plus infrared, and white plus infrared.

When it is irradiated from one direction, the spectrum sensed by the photosensitive pixels located on the reverse of the base layer is orthogonal to the spectrum sensed by the photosensitive pixels located at the same positions on the obverse.

Further, when it is irradiated from one direction, the spectrum sensed by the photosensitive pixels located on the reverse is complementary with the spectrum sensed by the photosensitive pixels located at the same position on the obverse.

The multi-spectrum sensing device further comprises a direction-selecting means configured for, when all or part of pixels on a selected side are sensing, shading the pixels at the corresponding positions on the side symmetrical to the selected side.

The direction-selecting means could be a synchronous multi-shutter system, each shutters therein is arranged in front of each side of the base layer, and two shutters in a set in front of two sides opposite to each other are respectively in the opened state and closed stated at the same time.

The direction-selecting means may also be a shading film, wherein the shading film is coated on part of pixels on each side of the base layer in accordance with a preset direction-selected-by-pixel pattern, and for two pixels located on the same position on both the front side and back side, at most only one of which is coated by the shading film.

The direction-selected-by-pixel pattern is selected from a diagonal pattern, an every-three-column horizontal pattern, an every-two-column horizontal pattern, an every-three-row vertical pattern, an every-two-row vertical pattern, and an area-division pattern.

In the multi-spectrum photosensitive device, the pixels on the obverse and the reverse are symmetric on direction.

In the multi-spectrum photosensitive device, a set of lens is installed respectively in front of each side of the base layer.

A method of manufacturing the above-mentioned multi-spectrum sensing device, comprising:

providing at least one transparent base layer; wherein each of the base layer comprises at least two sides;

at least two of the sides of the base layer are provided with photosensitive pixel groups, each of the photosensitive pixel groups is used for sensing light of interested spectrum irradiated from the reverse direction or the obverse direction of the side the photosensitive pixel groups located on.

Beneficial Effect

First of all, the manufacture process could be simplified by providing a base layer comprising at least two sides on which photosensitive pixels are arranged. The multi-layer sensing devices in the prior arts (including those disclosed in the patent application titled "A Multi-Spectrum Photosensitive Device and Manufacturing Method Thereof" applied by the inventor earlier) are a kind of three-dimensional manufacture process, which needs to process the chip layer by layer, and finally mold each processed layer together, thus the manufacture process is relatively complicated and the production yield is hard to be increased. Whereas the present disclosure performs processing on each side of the base layer, which is a manufacture process closer to plane process technology, for example, if the base layer has two sides, after the obverse is processed, it is merely necessary to turn the base layer over and perform processing on the reverse directly, therefore a great simplification is achieved on the manufacture process. Secondly, the observation of different views from different directions is implemented with the same one device by setting sensing pixels on the different sides of the base layer. For instance, also taking a base layer with two sides as an example, when the base layer is opaque, both the obverse and reverse of the base layer could sense light from each side respectively, so as to acquire the views on the forward directions respectively. When the base layer is transparent, both the obverse and reverse of the base layer could also sense light respectively so as to acquire the views respectively by means of shutter or pattern of direction-selected-by-pixel. Compared with the prior arts, to obtain views from different directions, the approach in prior arts is to adopt plural sets of sensing chips and processing circuits thereof; whereas the approach according to the present disclosure is to sense views from different directions on different sides of a base layer, thus besides multiple groups of lights sensed from different directions, only a processing circuit is needed which includes a photoelectrical conversion circuit, an electrical signal processing, an output circuit, and a transmission line, thus saving space and money.

As for a transparent base layer, sensing pixels are provided on the same position at both the obverse and reverse. The same position at both the obverse and reverse herein means that, under the irradiation of light source, the corresponding positions on the two sides are irradiated by the same ray. Taking a base layer with two sides as example, if a point light source vertically irradiates the obverse of the base layer, the irradiating position on the obverse of the base layer is point A and the irradiating position on the reverse of the base layer irradiated through the base layer is point B, whereas Point A and Point B are located on the same position of two opposite sides. Thus there is a problem that: the obverse light source will irradiate Point A and Point B and the reverse light source will also irradiate Point B and Point A, which causes interference between the views from two directions. In order to eliminate such bidirectional interference, a simple processing mode is to provide photosensitive pixels on one side of those two opposite sides, and no photosensitive pixels on the same one position of the other side. However there are various advantages by providing sensing pixels at the same position on two opposite sides, such as, the incident light energy of all the spectra segments could be greatly utilized for acquiring higher efficiency of light so as to achieve higher sensitivity and dynamic range, and meanwhile reducing the electrical noise signal produced by conversion from light energy to heat energy. For that purpose, according to the present disclosure, by adopting the direction-selecting means, the obverse light source □ cannot reach Point B and Point A when the obverse light source □ irradiates Point A and Point B, or the obverse light source □ cannot reach Point A and Point B (i.e., direction-selected-by-timesharing pattern) when the obverse light source □ irradiates Point B and Point A; or with the direction-selected-by-pixel pattern, i.e. setting Point A and Point B as an obverse sensing group to sense the obverse light source □, setting Point C (located on the reverse) and Point D (located on the obverse) as a reverse sensing group to sense the obverse light source □, so that only one of the two pixels located at the same position of the opposite sides obverse and reverse is coated by a shading film, which staging the positions of the pixels coated by the shading film on the opposite sides, so as to ensure maximally making use of the incident light energy and simultaneously implement acquirement of views of different directions without being interfered.

It is necessary to emphasize that, the double-sided double-layer photosensitive device with transparent base layer disclosed in the present disclosure does not only bring forward huge convenience and superiority for bidirectional sensing, but also greatly enhances the sensitivity of sensing device and the color representation gamut for single direction sensing. Meanwhile, the present invention provides a simple method for integrating implementation of sensing the color and infrared light on a sensing device at low cost.

Multi-spectrum photosensitive device for sensing visible and infrared lights will be discussed according to embodiments of the present disclosure, which are exemplary only for demonstrating the advantages and implementations of the present disclosure, but in no way to limit the protection scope of the present disclosure.

For those skilled in the art, the above and other purpose as well as advantages of the present invention will be apparent with the following detailed descriptions and illustrations of preferred embodiments with reference to the drawings as shown below.

DESCRIPTIONS OF THE DRAWINGS

FIG. 1 is a diagram showing a CYMG color filter pattern.

Figure 2:
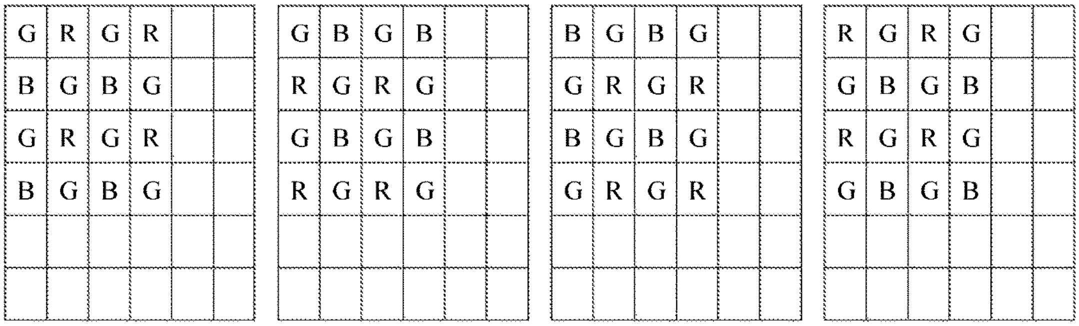
FIG. 2 is a diagram showing Bayer Pattern of RGB color filters and its variations.
Figure 3:
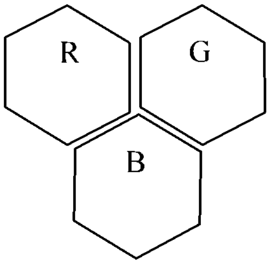
Figure 3:
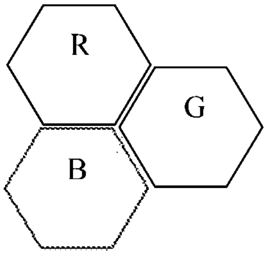

FIGS. 3(*a*) and 3(*b*) are the diagrams showing honeycomb patterns of RGB color filter respectively.

Figure 4:
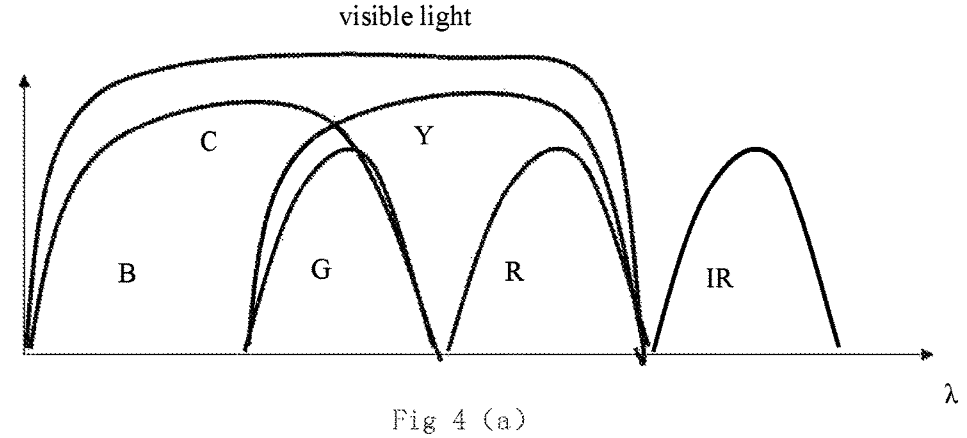
Figure 4:
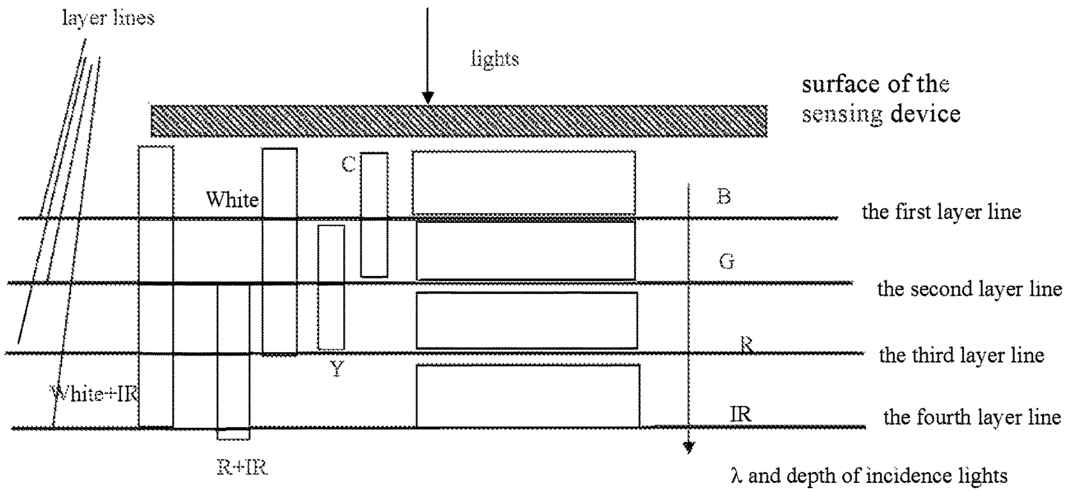

FIG. 4(*a*) is a diagram explaining the relationship between spectra of red, green, blue, yellow, cyan, white and infrared; FIG. 4(*b*) is a diagram explaining the relationship between the incident depth and the wavelength of light in an (opaque) object, in which layer lines are used for simplifying the implementations of different sensing devices.

Figure 5:
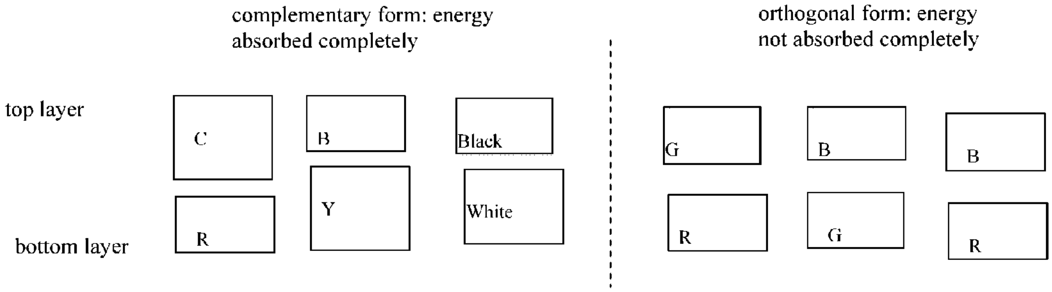
Figure 5:
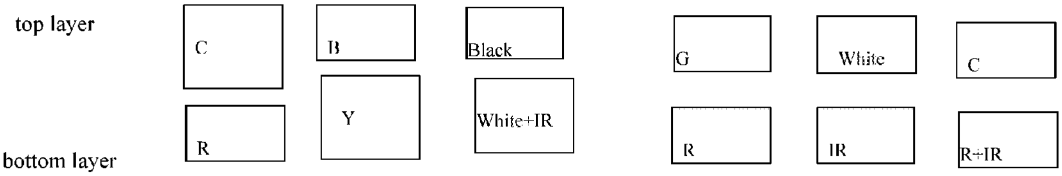

FIGS. 5(*a*) and 5(*b*) show examples of some orthogonal and complementary color pairs, wherein the colors of the two layers up and down in the left of FIGS. 5(*a*) and 5(*b*) are complementary, and the colors of the two layers up and down in the right of FIGS. 5(*a*) and 5(*b*) are orthogonal.

Figure 6:
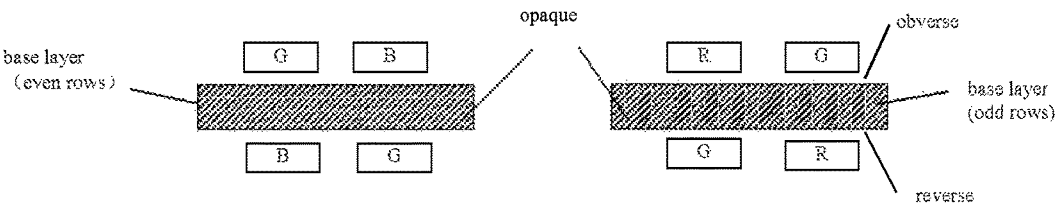
Figure 6:
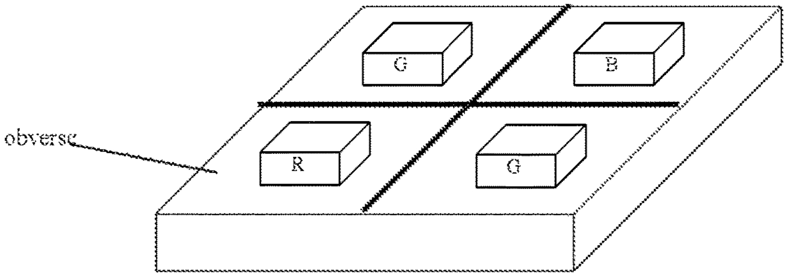
Figure 6:
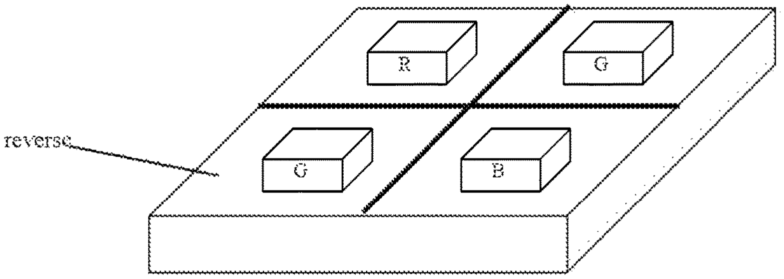

FIGS. 6(*a*)-6(*c*) illustrate a preferred embodiment of a double-side double-layer color sensing device with a Bayer Pattern according to the present disclosure, wherein the base layer is opaque and the obverse is completely symmetrical to the reverse. It is noticed that since the sensing device illustrated in FIGS. 6(*a*), 6(*b*) and 6(*c*) have characteristics of double-layer as well as double-sided simultaneously, it is called a double-sided double-layer color sensing device.

Figure 7:
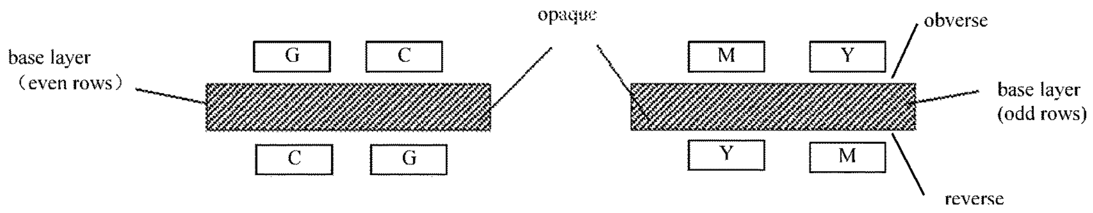
Figure 7:
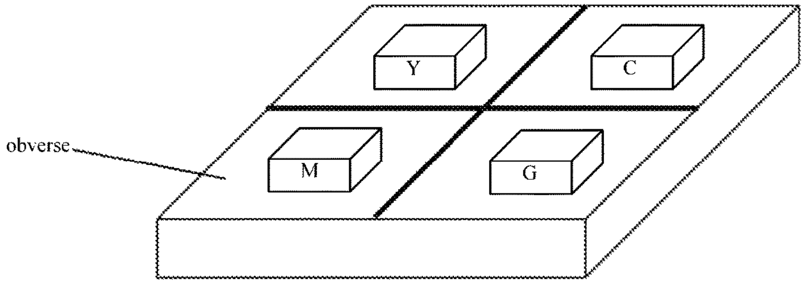
Figure 7:
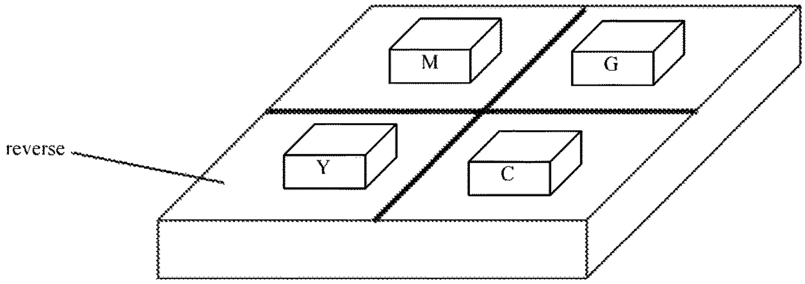

FIGS. 7(*a*)-7(*c*) illustrate a preferred embodiment of a double-sided double-layer color sensing device with an opaque base layer according to the present disclosure and its variation that use a generalized Bayer Pattern, wherein the base layer is opaque and the obverse is completely symmetrical to the reverse. The preferred embodiment could lead to a sensing device of CYMG colors.

Figure 8:
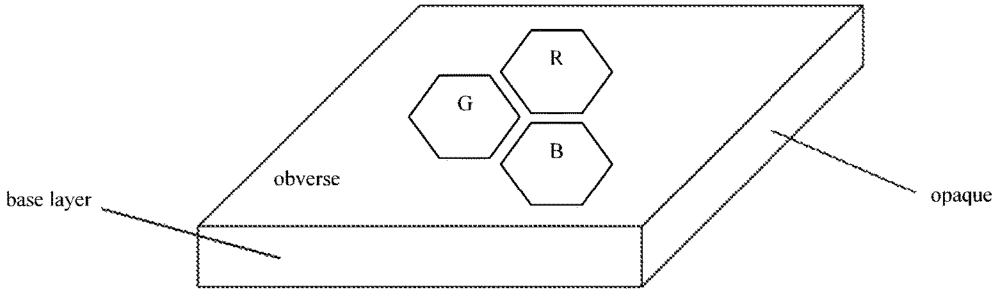
Figure 8:
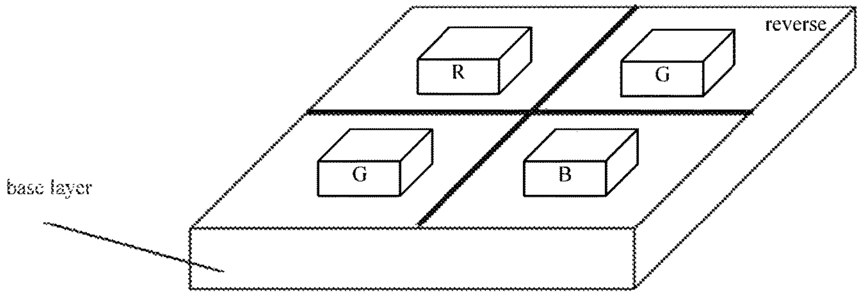
Figure 8:
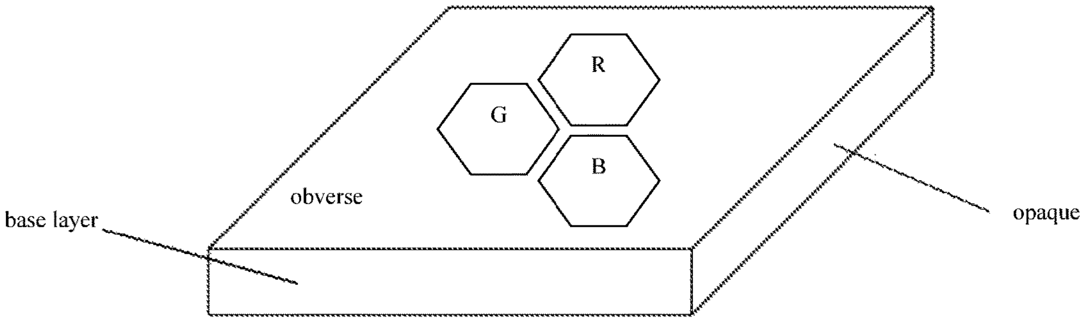
Figure 8:
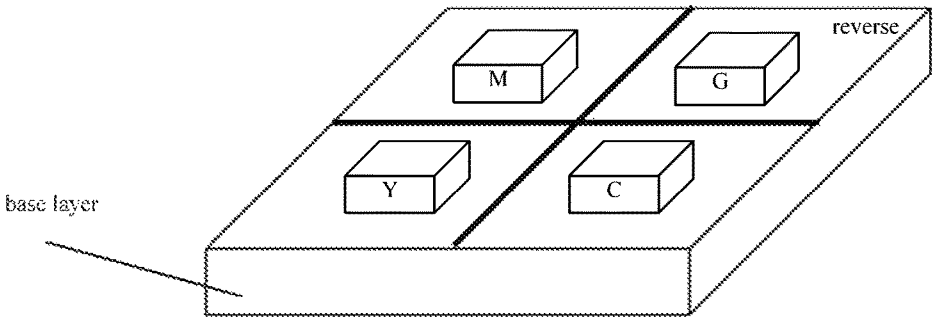

FIGS. 8(*a*)-8(*d*) illustrate a preferred embodiment of a double-sided double-layer color sensing device with the obverse adopting in a honeycomb pattern according to the present disclosure and variations thereof, wherein the base layer is opaque and the reverse adopts a Bayer Pattern (FIG. 8(*b*)), or a honeycomb pattern (FIG. 8(*c*)), or a uniform pattern (FIG. 8(*d*)), or other patterns. The figures explain that for a double-sided double-layer color sensing device with an opaque base layer, the obverse and reverse could adopt any pattern if necessary, rather than must be completely identical.

Figure 9:
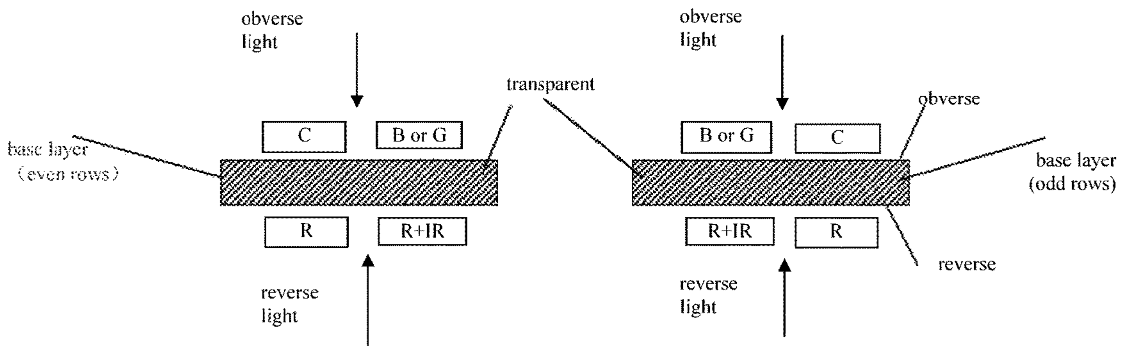
Figure 9:
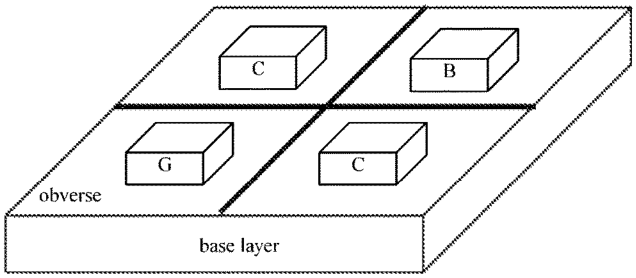
Figure 9:
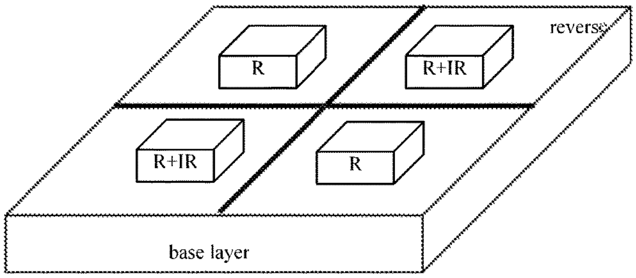

FIGS. 9(*a*)-9(*c*) illustrate a preferred embodiment of a double-sided double-layer color sensing device with a transparent base layer according to the present disclosure, wherein the base layer is transparent, and the obverse adopts a Bayer Pattern of cyan, green and blue colors while the reverse adopts a pattern of red or infrared. In the illustrated example, pixels sensing red and red plus infrared respectively are disposed on a diagonal.

Figure 10:
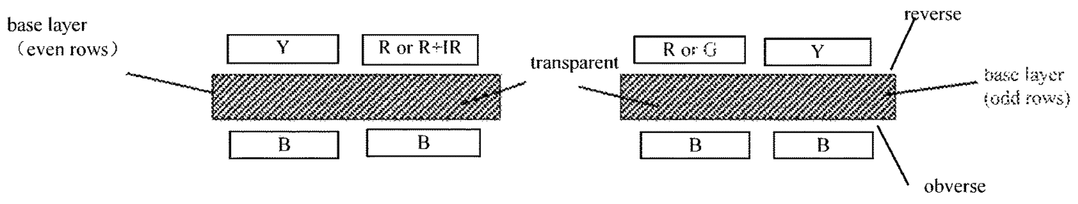
Figure 10:
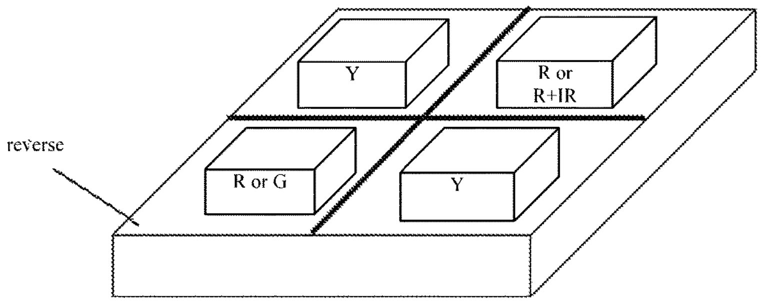
Figure 10:
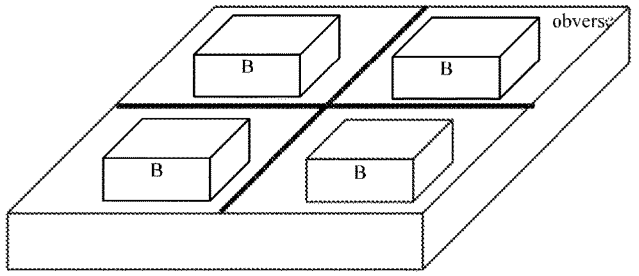

FIGS. 10(*a*)-10(*c*) illustrate another preferred embodiment of a double-sided double-layer color sensing device with a transparent base layer according to the present disclosure, wherein the base layer is transparent, and the obverse is used for sensing blue while the reverse is used for sensing yellow, green, red or infrared.

Figure 11:
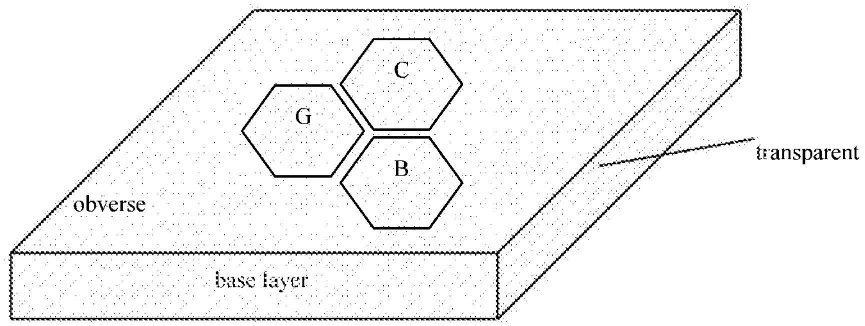
Figure 11:
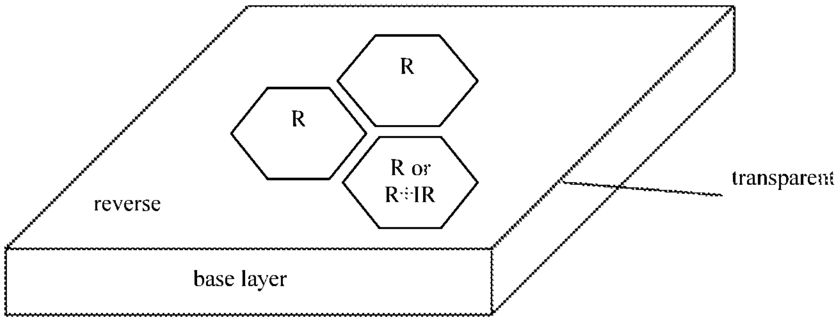

FIGS. 11(*a*)-11(*b*) illustrate another preferred embodiment of a double-sided double-layer color sensing device with a transparent base layer according to the present disclosure, wherein the base layer is transparent, and the obverse adopts a honeycomb pattern of blue, green and cyan color while the reverse adopts a honeycomb pattern of red or infrared. Pixels on the obverse are completely corresponding on the geometrical position with those on the reverse so that the light irradiated from the obverse could radiate through the base layer to the reverse. In the illustrated example, ⅔ pixels on the reverse sense red color and ⅓ pixels sense red or red plus infrared.

Figure 12:
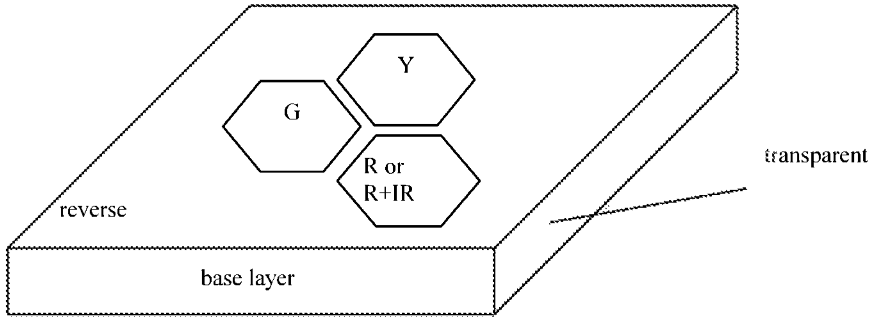
Figure 12:
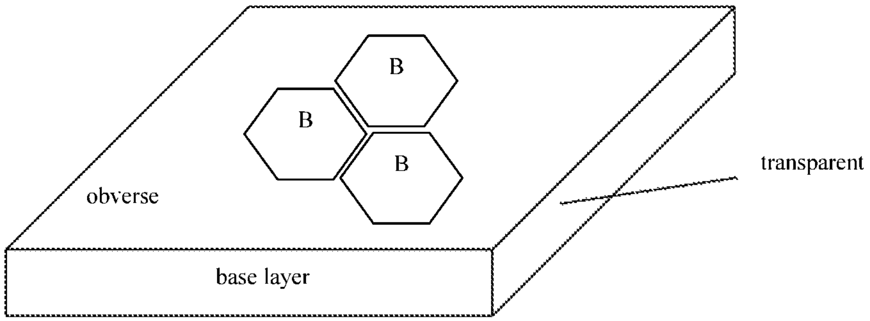

FIGS. 12(*a*)-12(*b*) illustrate another preferred embodiment of a double-sided double-layer color sensing device with a transparent base layer according to the present disclosure, wherein the base layer is transparent, and the obverse adopts a honeycomb pattern of blue while the reverse adopts a honeycomb pattern of red, green and yellow. Pixels on the obverse are completely corresponding on the geometrical position with those on the reverse so that the light irradiated from the obverse could radiate through the base layer to the reverse.

Figure 13:
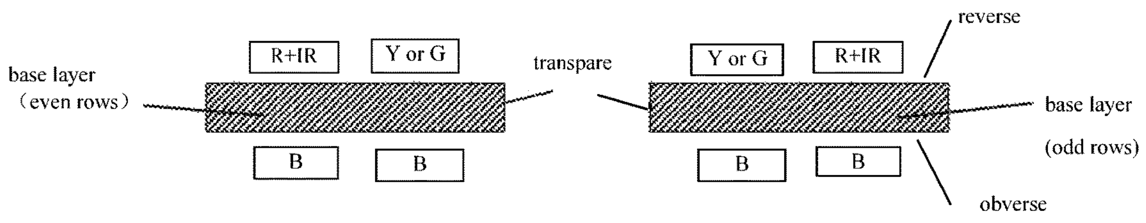
Figure 13:
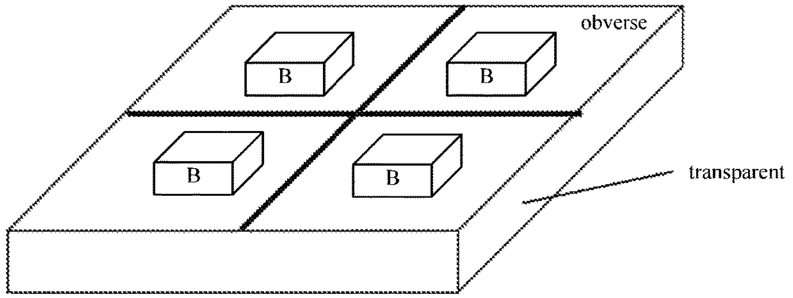
Figure 13:
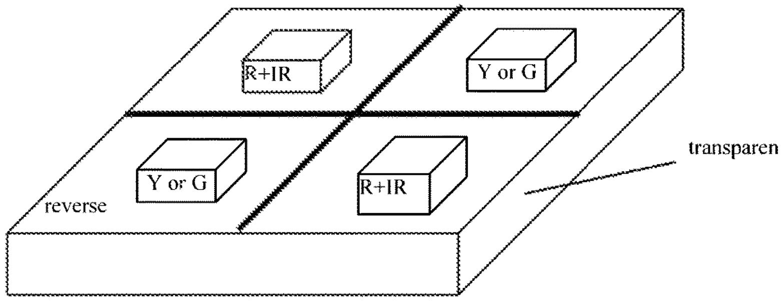

FIGS. 13(*a*)-13(*c*) illustrate a preferred embodiment of a double-sided double-layer color sensing device with a transparent base layer according to the present disclosure, wherein the base layer is transparent, and the obverse adopts a uniform pattern of blue, while the reverse adopts a generalized Bayer Pattern of red plus infrared, green and yellow. Pixels on the obverse are completely corresponding on the geometrical position with those on the reverse so that the light irradiated from the obverse could radiate through the base layer to the reverse.

Figure 14:
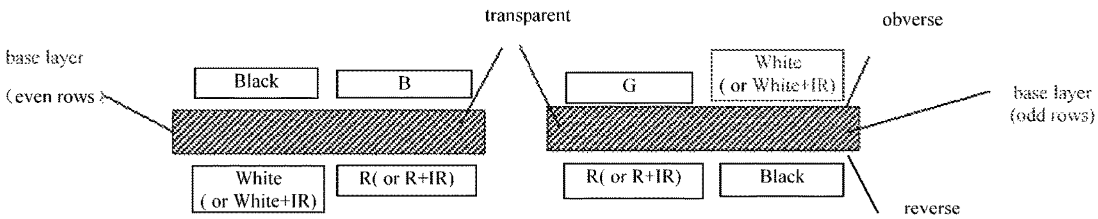
Figure 14:
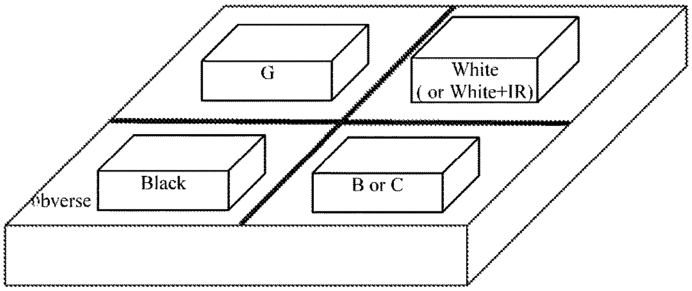
Figure 14:
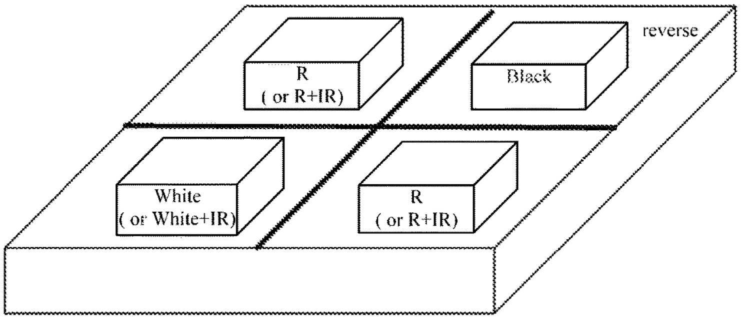

FIGS. 14(*a*)-14(*c*) illustrate a preferred embodiment of a double-sided double-layer color sensing device with a transparent base layer according to the present disclosure, wherein the base layer is transparent, and the obverse adopts a uniform pattern of blank color, green, blue and white (or white plus infrared), while the reverse adopts a generalized Bayer Pattern of red plus infrared, blank and white (or white plus infrared). Pixels on the obverse are completely corresponding on the geometrical position with those on the reverse so that the light irradiated from the obverse could radiate through the base layer to the reverse.

Figure 15:
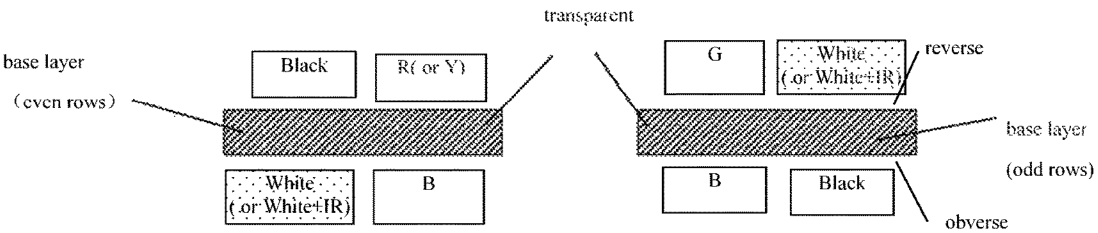
Figure 15:
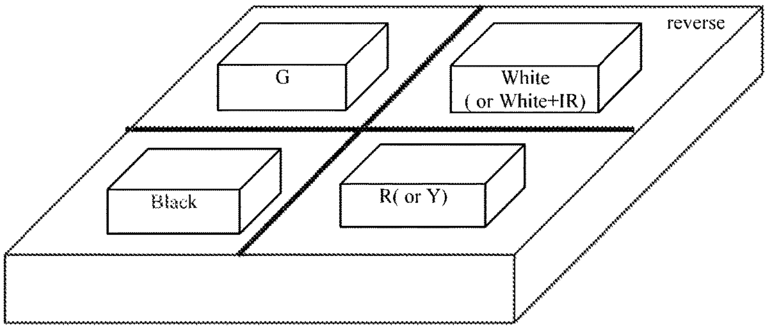
Figure 15:
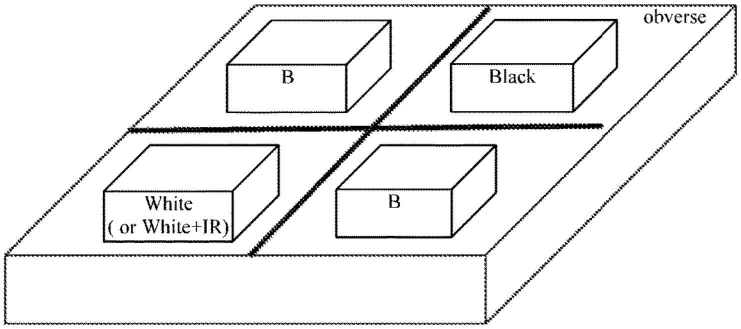

FIGS. 15(*a*)-15(*c*) illustrate another preferred embodiment of a double-sided double-layer color sensing device with a transparent base layer according to the present disclosure, wherein the base layer is transparent, and the obverse adopts a uniform pattern of blank color, green, blue, red (or yellow) and white (or white plus infrared), while the reverse adopts a generalized Bayer Pattern of blue, blank and white (or white plus infrared). Pixels on the obverse are completely corresponding on the geometrical position with those on the reverse so that the light from the obverse could radiate through the base layer to the reverse.

Figure 16:
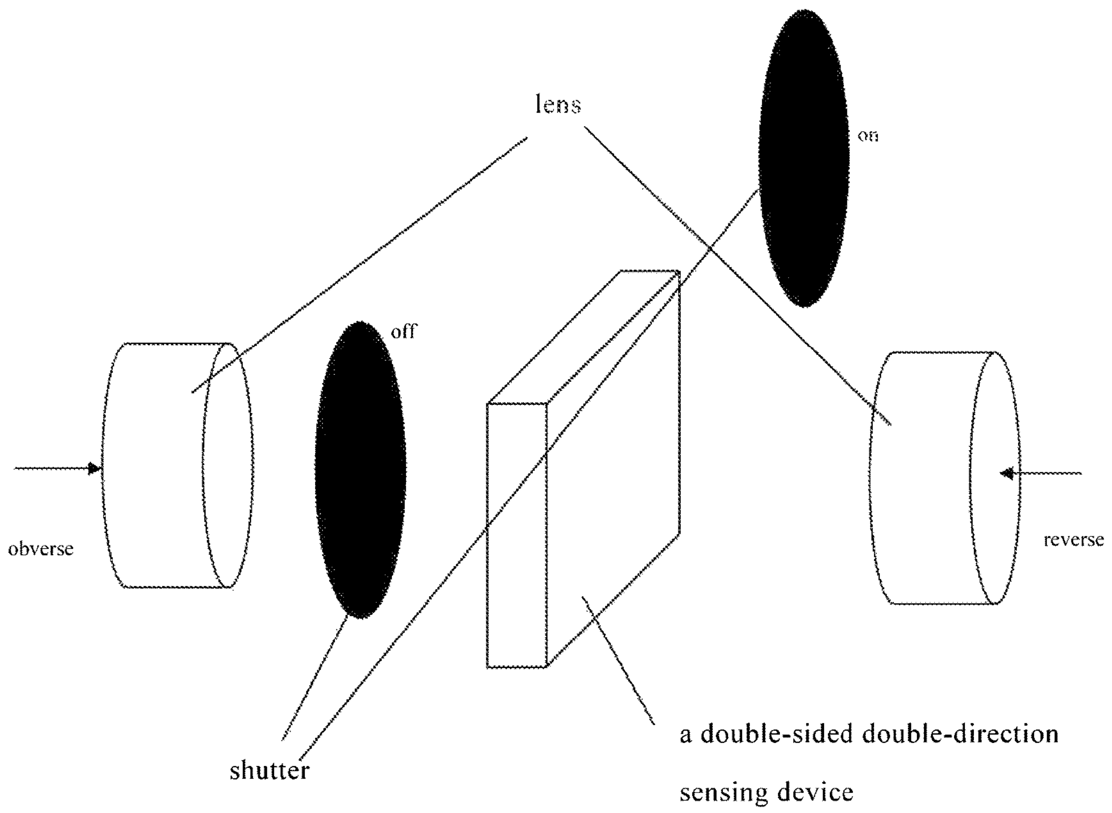

FIG. 16 is a diagram showing a double-direction sensing system with a double-sided double-layer sensing device with a transparent base layer. In the system, the double-sided double-layer sensing device is at the center, because of the transparent base layer, sensing pixels on the obverse could accept simultaneously light from the obverse and light from the reverse. In order to separate views of the obverse from views of the reverse, system uses a synchronized mechanical shutter system in which a shutter is opened while another shutter is closed. When the mechanical shutter at the obverse is in closed state, the shutter on the reverse is in opened state, vice versa.

Figure 17:
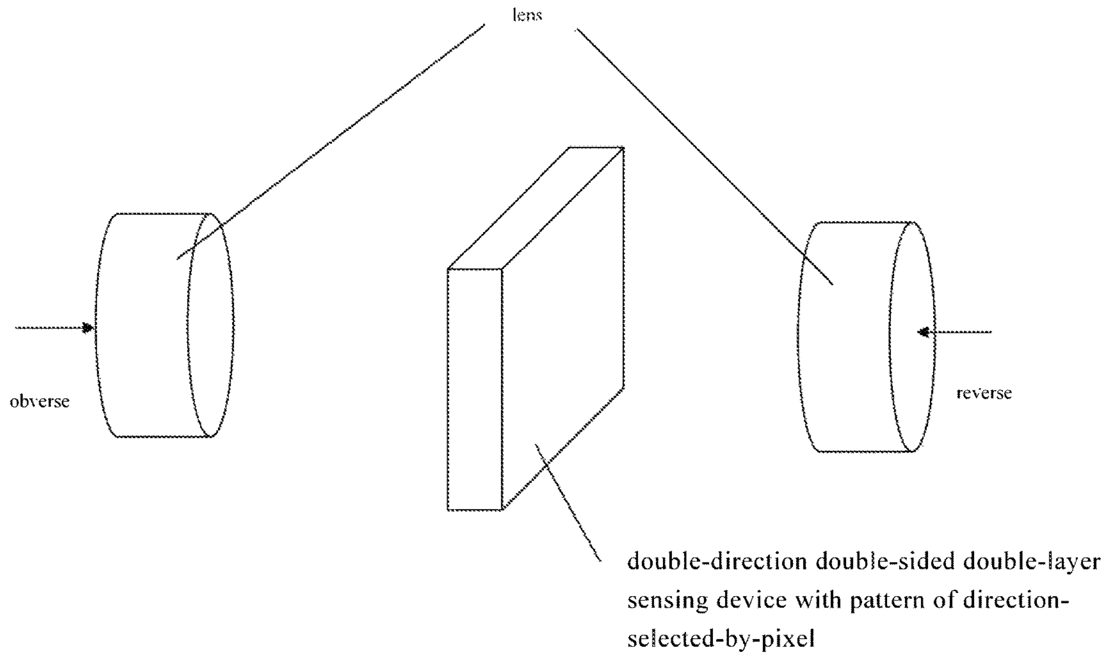

FIG. 17 is a diagram showing a double-direction sensing system with a double-sided double-layer sensing device adopting direction-selecting means. In the system, the double-sided double-layer sensing device is at the center, because of the transparent base layer, the sensing device could be a double-direction double-sided double-layer sensing device with an opaque base layer, or a double-direction double-sided double-layer sensing device with pattern of direction-selected-by-pixel. In the system, since the sensing device has the function of direction-selecting, thus the sensing device could accept lights both of obverse and reverse without a mechanical shutter, and view of the obverse on the obverse pixels and view of the reverse on the reverse pixels may be obtained.

Figure 18:
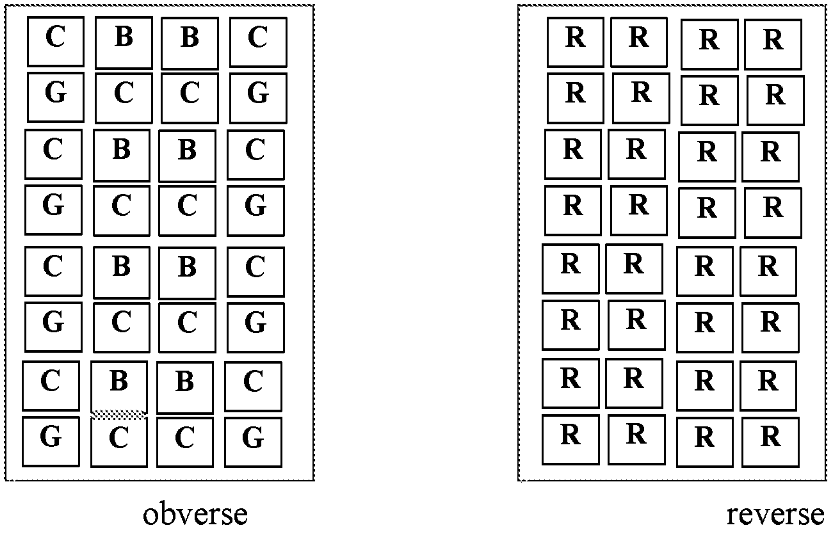
Figure 18:
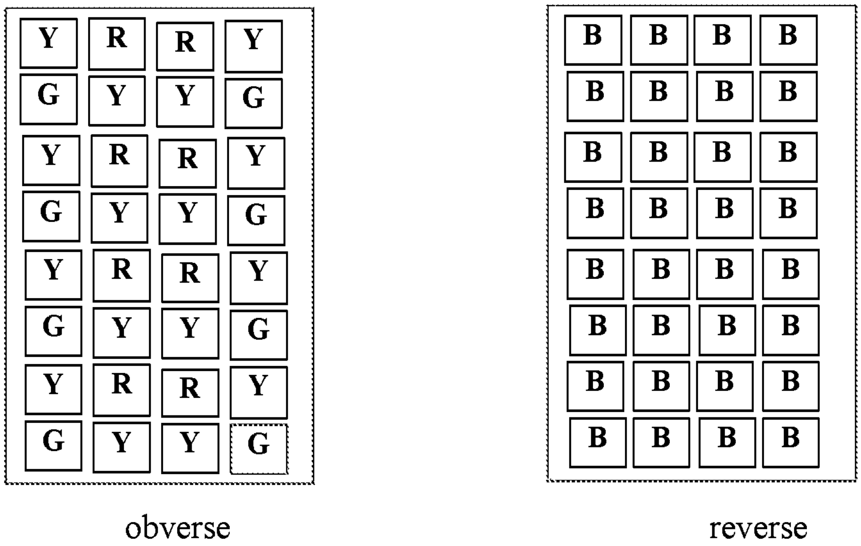

FIG. 18 shows a double-sided double-layer sensing device with direction-selected-by-pixel pattern which is not coated by an opaque film. FIG. 18(*a*) illustrates that when irradiated from the obverse, the pixels on the obverse of the sensing device will sense cyan, green and blue, while the pixels on the reverse sense red. FIG. 18(*b*) illustrates that when irradiated by the light of the reverse, the pixels on the reverse of the sensing device sense yellow, green and blue, while the pixels on the reverse pixels sense blue. It is noticed that the pixels on the obverse are grouped, each group is consists of eight pixels, not of four pixels, and form a repeat arrangement. That is, the former 4 pixels and the later 4 pixels in a group form vertical mirror symmetry. The purpose of such an arrangement is preparation for diagonal arrangement of the opaque film as shown in the FIG. 19.

Figure 19:
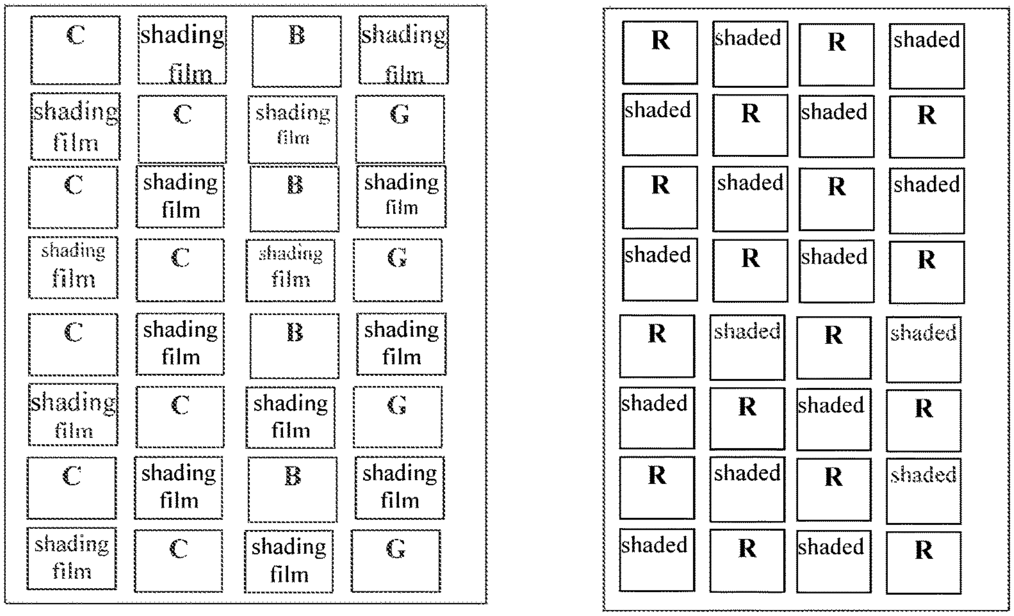
Figure 19:
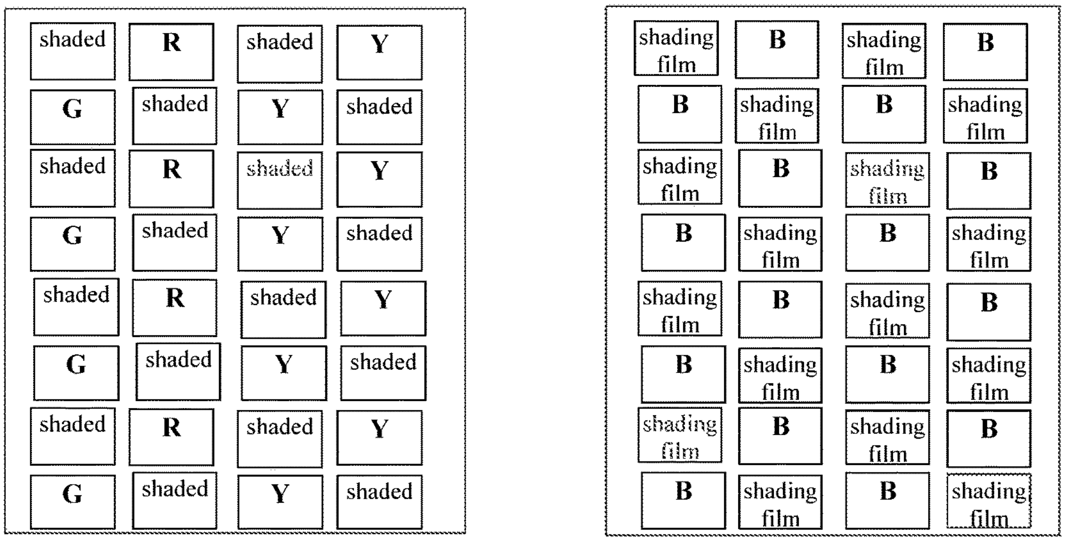

FIGS. 19(*a*) and 19(*b*) illustrate double-direction sensing device which is produced by coating a diagonal opaque film on the double-sided double-layer sensing device as shown in FIG. 18. The left of FIG. 19(*a*) shows an opaque film coated on the surface of pixels on the backward diagonal line on the obverse. Then, when irradiated from obverse light, pixels at the diagonal line on the obverse sense cyan, blue and green, while pixels at the diagonal line on the reverse sense red; no matter the obverse or the reverse, because of the opaque film on the backward diagonal (of the obverse), pixels on the backward diagonal cannot sense light from the obverse. The right of FIG. 19(*b*) shows an opaque film on the surface of pixels at the forward diagonal on the reverse. Then, when irradiated from the reverse light, the pixels on the backward diagonal on the reverse sense blue, while pixels on the backward diagonal on the obverse sense red, green and yellow; no matter the obverse or the reverse, because of the opaque film on the forward diagonal (of the obverse), pixels on the forward diagonal cannot sense light from the reverse. Therefore, the result is that pixels on the obverse of the double-direction double-sided double-layer sensing device will acquire the obverse views, while the reverse will acquire the reverse views, so that the views of the obverse and the reverse are acquired separately.

Figure 20:
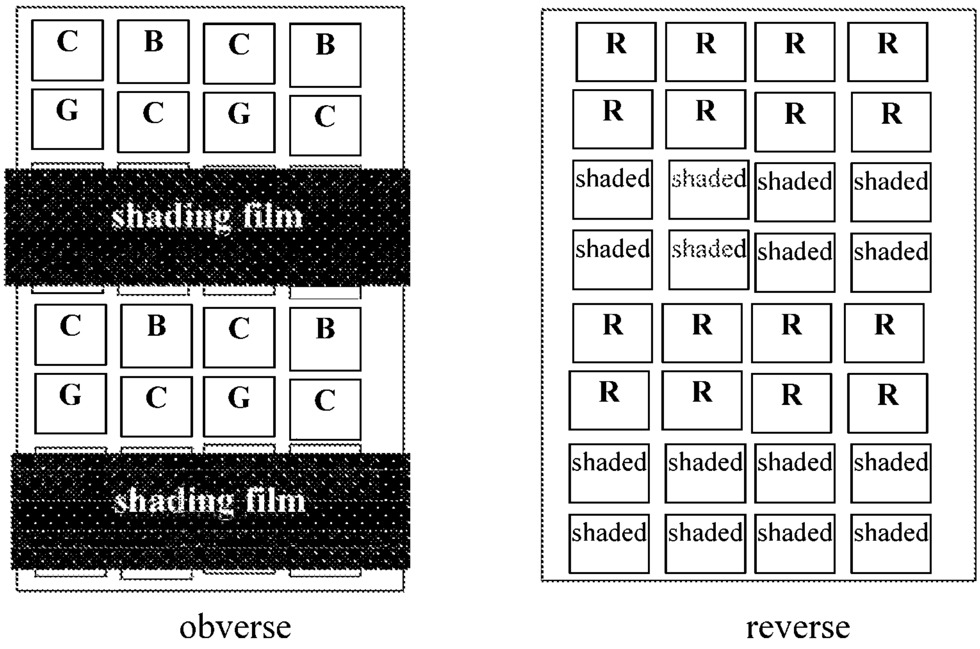
Figure 20:
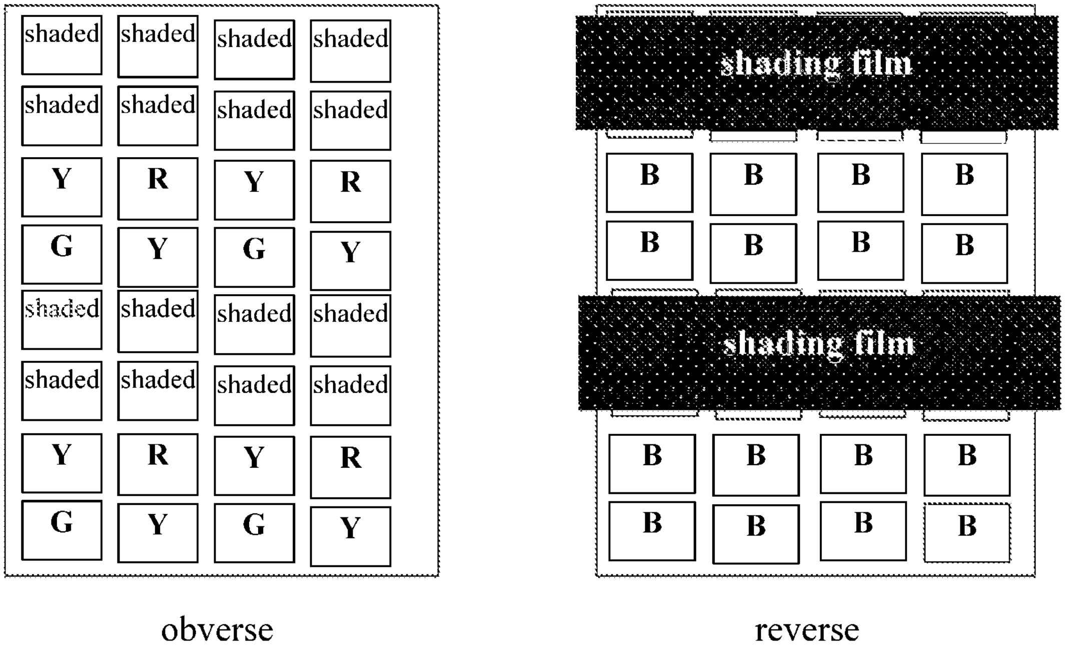

FIGS. 20(*a*) and 20(*b*) show a preferred embodiment of a double-sided double-layer sensing device with a horizontal two-lined shading plating film. The left of FIG. 20(*a*) illustrates the shading film on the obverse and irradiation from the obverse, wherein the outer surface of the sensing pixels on the obverse is coated with shading film every two lines, and the sensing pixels without shading film are arranged in a generalized Bayer Pattern sensing the color spectra of cyan, blue and green respectively. The right of FIG. 20(*a*) illustrates the sensing pixels on the reverse when irradiated from the obverse, wherein the pixels on reverse, which are unable to be irradiated due to the film coated on the corresponding positions on the obverse, cannot sense (but capable of sensing the light from reverse). Since pixels on the obverse are not coated with a film, the sensing pixels at the corresponding positions on the obverse can sense red light from the obverse. The right of FIG. 20(*b*) illustrates the shading film on the reverse and the irradiation from the reverse, wherein the outer surface of the sensing pixels on the reverse are coated with shading film every three lines (interleaving with the shading film on the obverse), and the sensing pixels without shading film sense the spectrum of blue. The left of FIG. 20(*b*) illustrates the sensing pixels on the obverse when irradiated from the reverse, the sensing pixels on the obverse, which are unable to be irradiated due to the shading film coated on the corresponding position on the reverse, cannot sense (hut capable of sensing the light from obverse). Since pixels on the obverse are not coated with a film, the sensing pixels on the obverse without the shading film can sense red, green and yellow light from the obverse. The pixels without being coated with a film may be arranged in various patterns, and the drawings herein are merely one of the preferred patterns.

Figure 21:
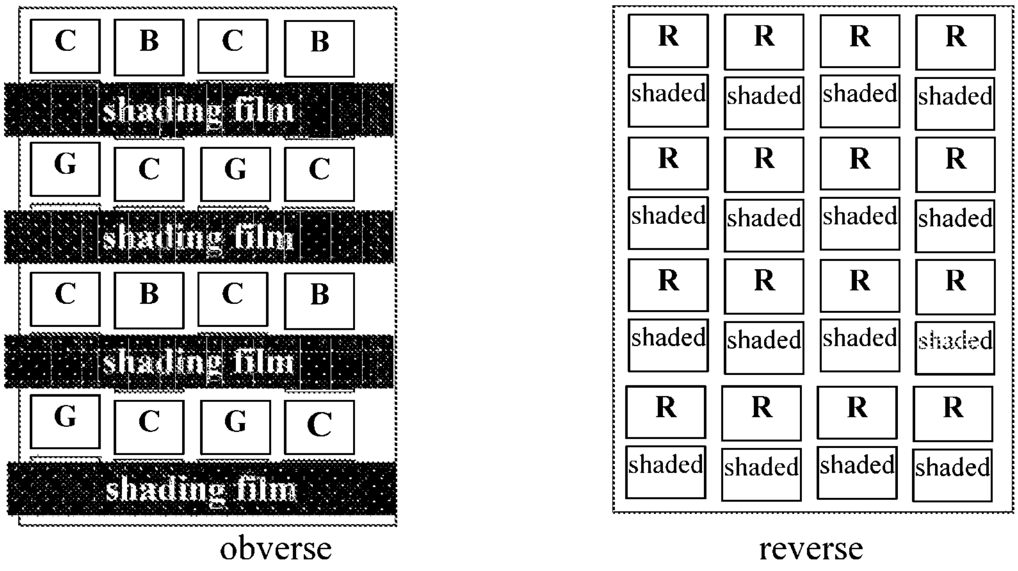
Figure 21:
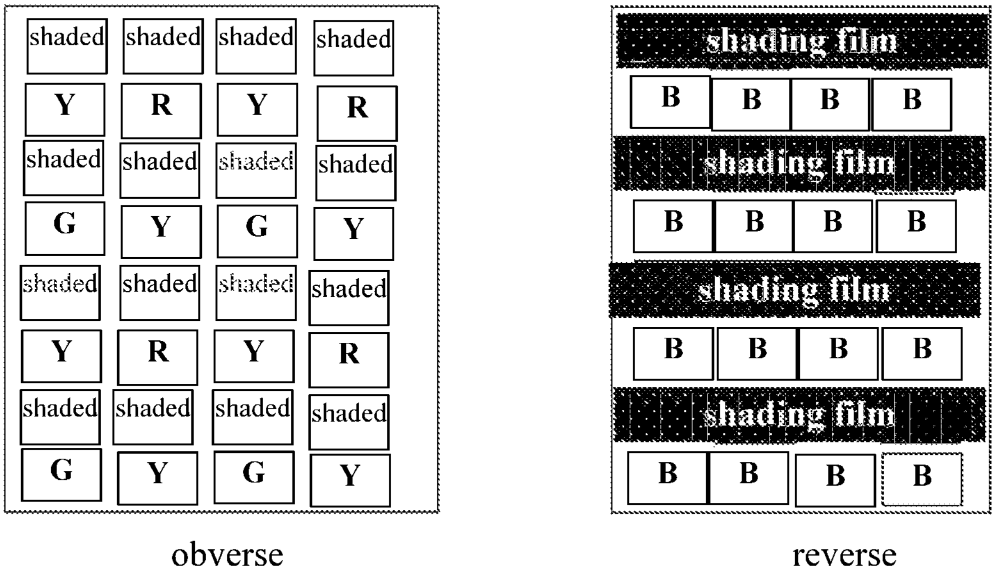

FIGS. 21(*a*) and (*b*) are similar to the FIGS. 20(*a*) and (*b*), but the pattern of the films is coated in every two lines instead of every three lines, correspondingly, the arrangement of the pixels without coated with films is also adjusted. The pixels without the films may be arranged in various patterns, and the drawings herein are merely one of the preferred patterns.

Figure 22:
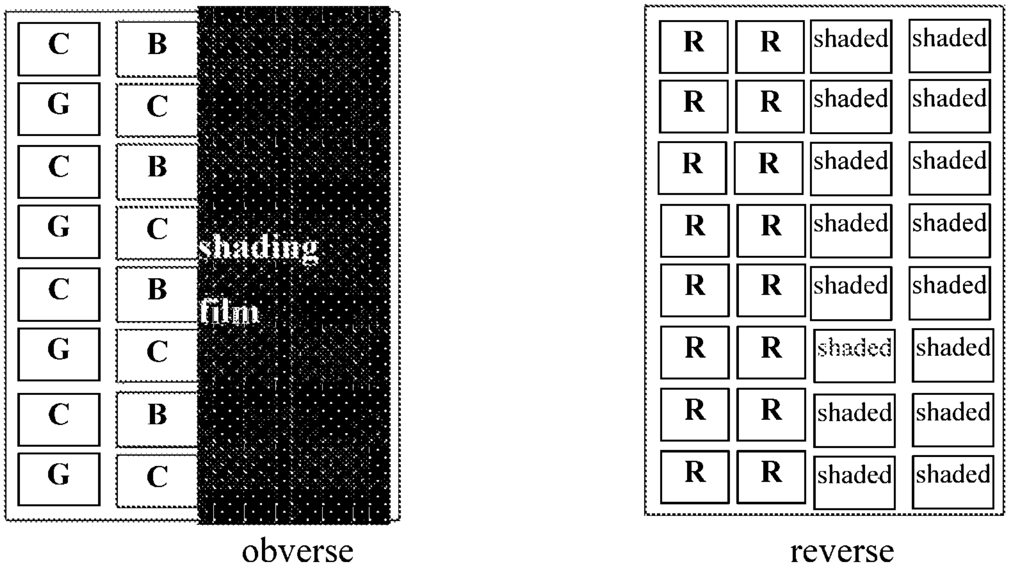
Figure 22:
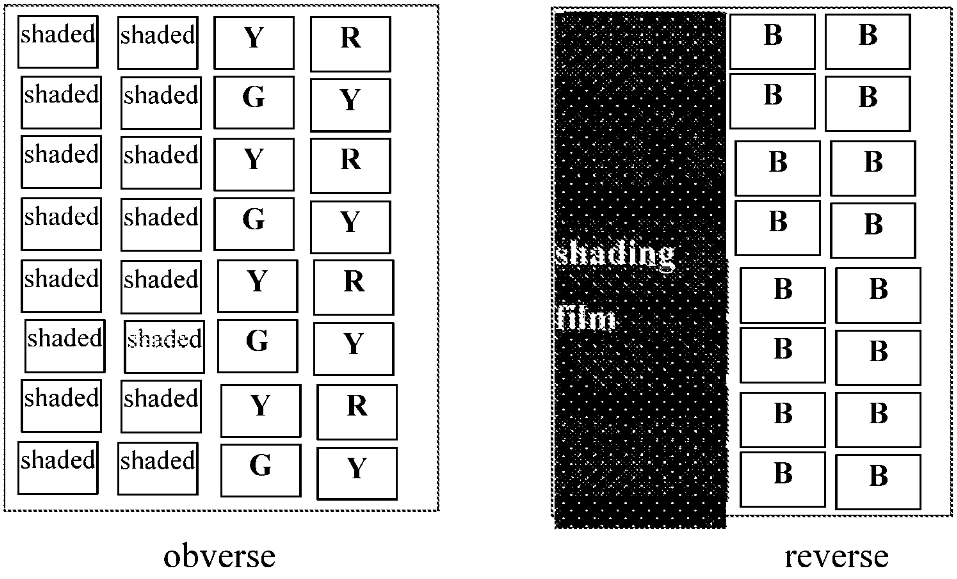

FIGS. 22(*a*) and (*b*) are similar to the FIGS. 20(*a*) and (*b*)), but the pattern of the films is coated in every three rows instead of every three columns, correspondingly, the arrangement of the pixels without coated with film is also adjusted. The pixels without the films may be arranged in have various patterns, and the drawings herein are merely one of the preferred patterns.

Figure 23:
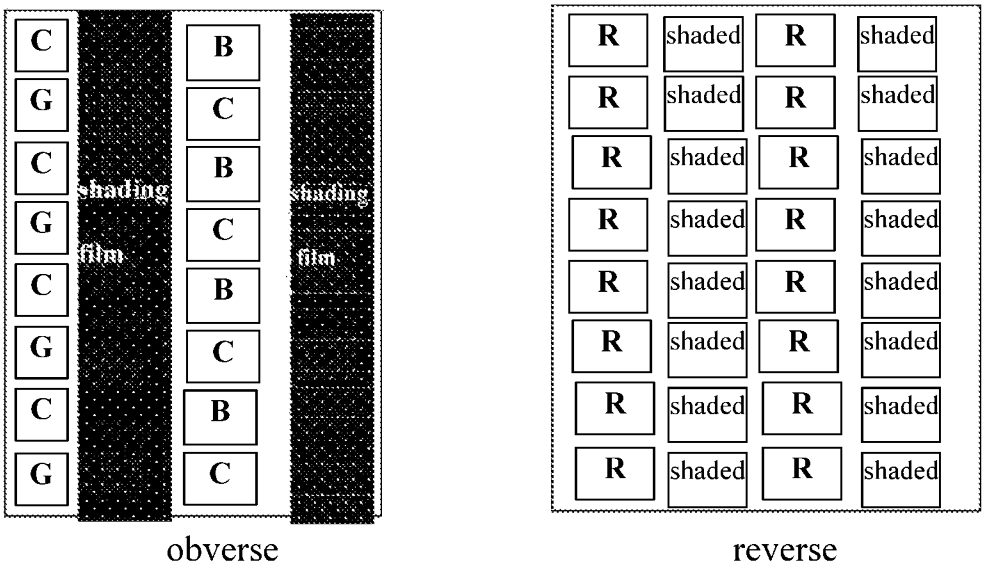
Figure 23:
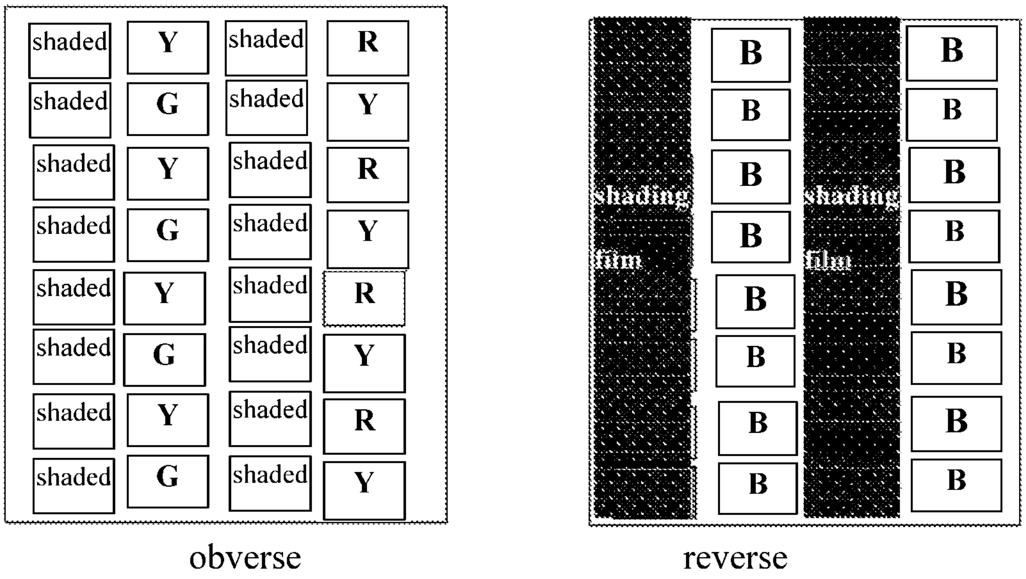

FIGS. 23(*a*) and (*b*) are similar to the FIGS. 20(*a*) and (*b*)), but the pattern of the films changes is coated in every two rows instead of every three columns, correspondingly, the arrangement of the pixels without coated with film is also adjusted. The pixels without the films may be arranged in various patterns, and the drawings herein are merely one of the preferred patterns.

Figure 24:
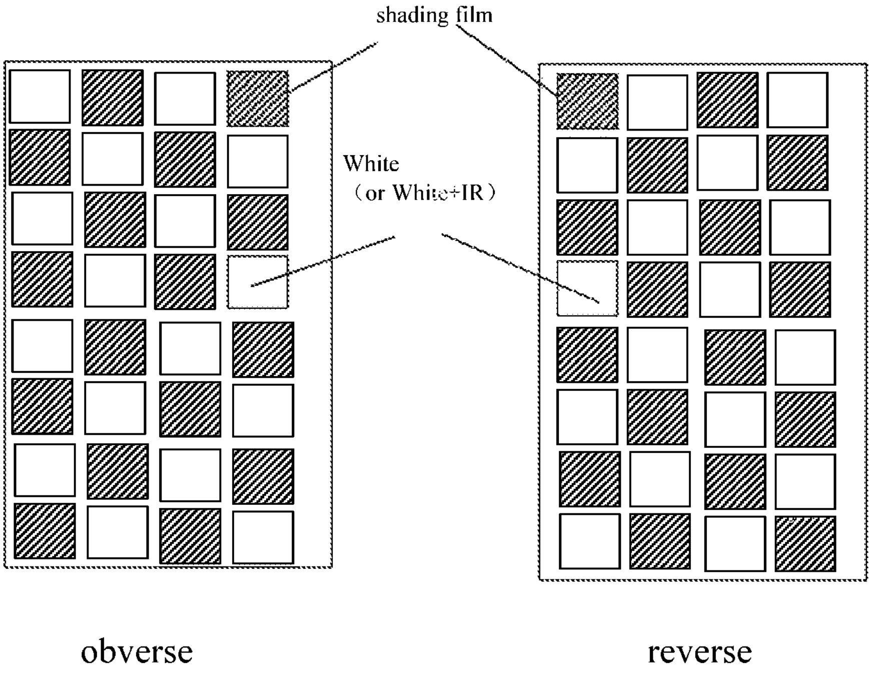

FIG. 24 illustrates a preferred mode of a shading film especially used for a double-direction monochrome sensing chip with pattern of direction-selected-by pixel sensing white (or white plus infrared). A higher spatial resolution could be obtained by using the mode. The double-direction monochrome sensing chip can also utilize the mode of coated horizontally or vertically as shown in FIGS. 21-24. The figures should not be regarded as a limitation to the method adopting the direction-selected-by-pixel pattern disclosed in the present disclosure.

Figure 25:
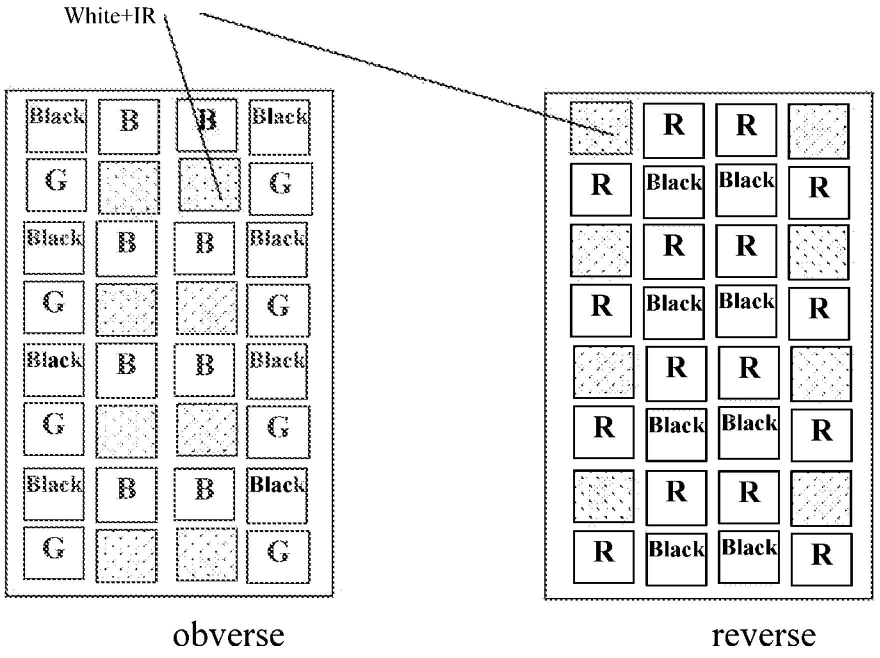
Figure 25:
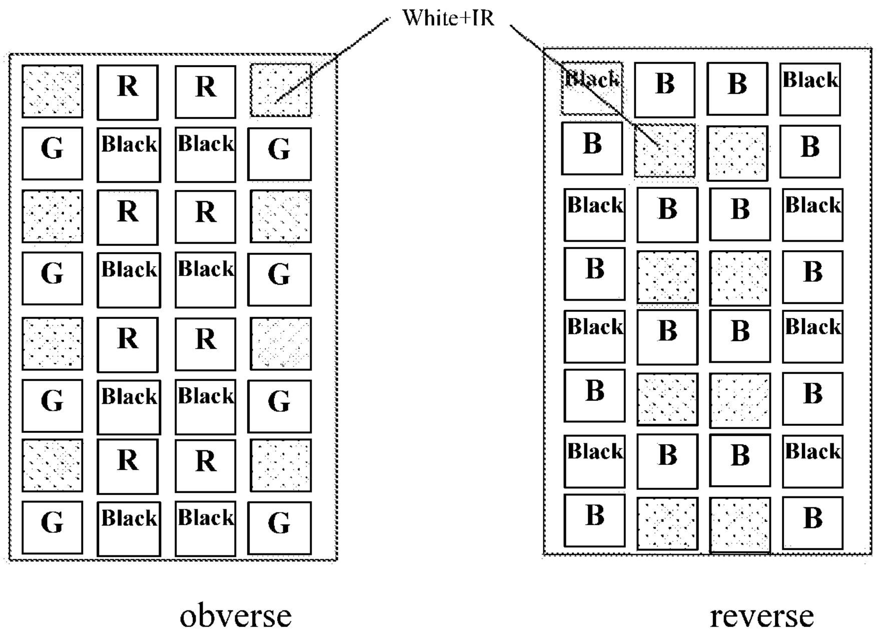

FIG. 25 shows a double-sided double-layer multi-spectrum sensing device with the direction-selected-by-pixel pattern which is not coated with an opaque film. As shown in FIG. 25(*a*), when radiated from the obverse, the pixels on the obverse of the sensing device sense blank color, green, blue and white plus infrared, while the pixels of the reverse sense blank color, red, and white plus infrared. As shown in FIG. 25(*b*), when radiated from the reverse, the pixels of the obverse sense blank color, green, red and white plus infrared, while the pixels of the reverse sense blue, blank, and white plus infrared. It is noticed that, the pixels on the obverse are grouped, each group is consists of eight pixels, not of four pixels, which form a repeat arrangement. That is to say, the former 4 pixels and the later 4 pixels in a group constitute vertical mirror symmetry. The purpose of such an arrangement is to prepare for diagonal arrangement of the opaque film as shown in FIG. 26.

Figure 26:
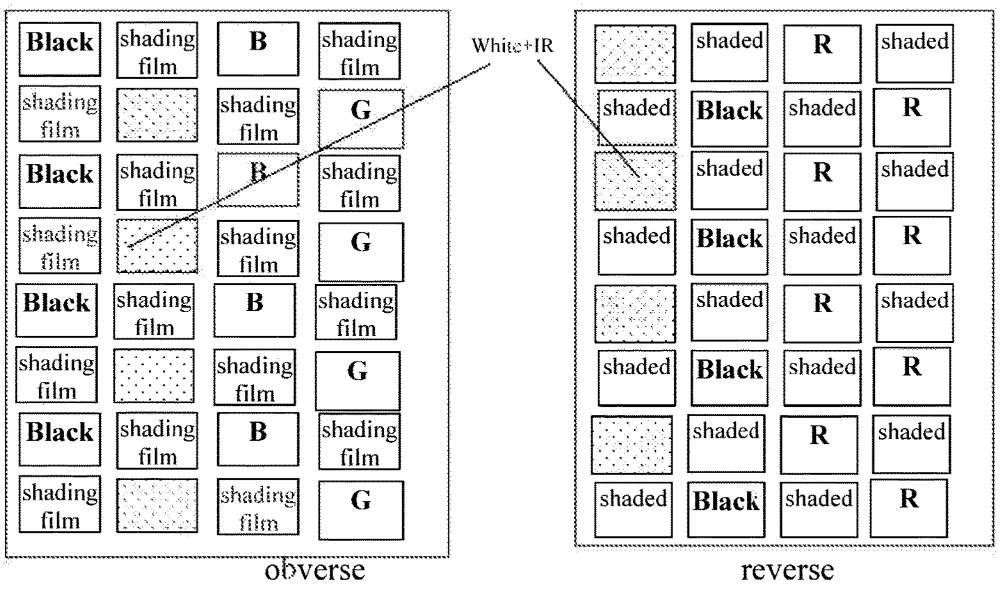
Figure 26:
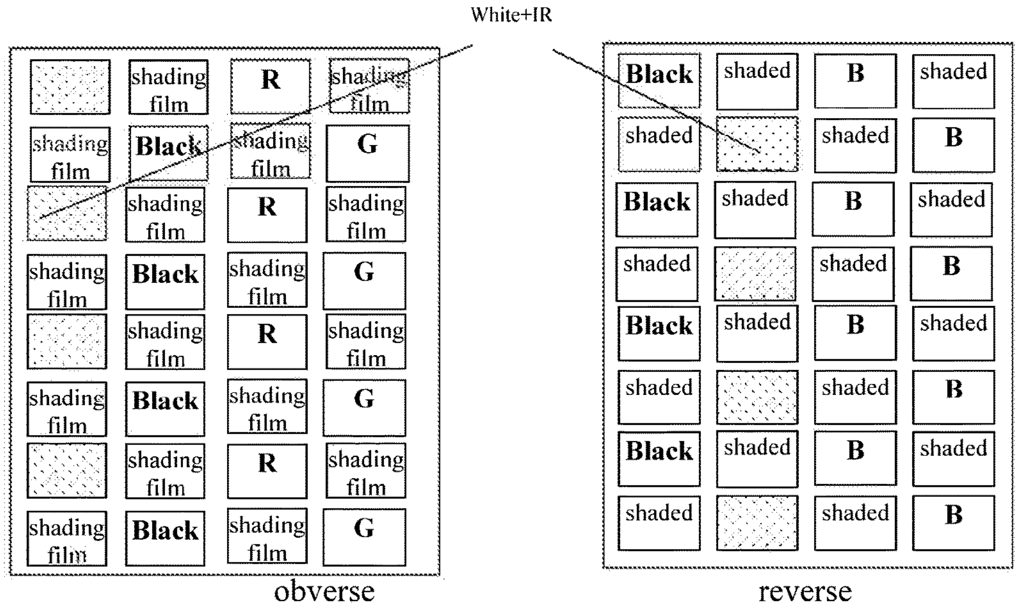

FIG. 26(*a*) and FIG. 26(*b*) show a double-direction sensing device which is produced by coating a diagonal opaque film on a double-sided double-layer multi-spectrum sensing device as shown in FIG. 18. The left of FIG. 26(*a*) shows an opaque film coated on the surface of the pixels on the backward diagonal on the obverse. Then, blank, blue, green and white plus infrared are sensed by pixels at the forward diagonal of the obverse, while red, blank, and white plus infrared are sensed by the pixels at the forward diagonal on the reverse; no matter for the obverse or the reverse, because of the opaque film on the backward diagonal (of the obverse), pixels on the backward diagonal cannot sense light from the obverse. The right of FIG. 26(*b*) shows the opaque film is coated on the surface of the pixels on the backward diagonal on the obverse. Then, blank, blue, green and white plus infrared are sensed by pixels on the forward diagonal of the obverse, while red, blank, and white plus infrared are sensed on the forward diagonal on the reverse; no matter for the obverse or the reverse, because of the opaque film on the backward diagonal (of the obverse), pixels on the forward diagonal cannot sense light from the obverse. Therefore the result is that, the obverse of the double-sided double-layer sensing device will obtain the view of the obverse while the reverse will obtain the view of the reverse, so as to obtain the views of the obverse and the reverse separately.

Figure 27:
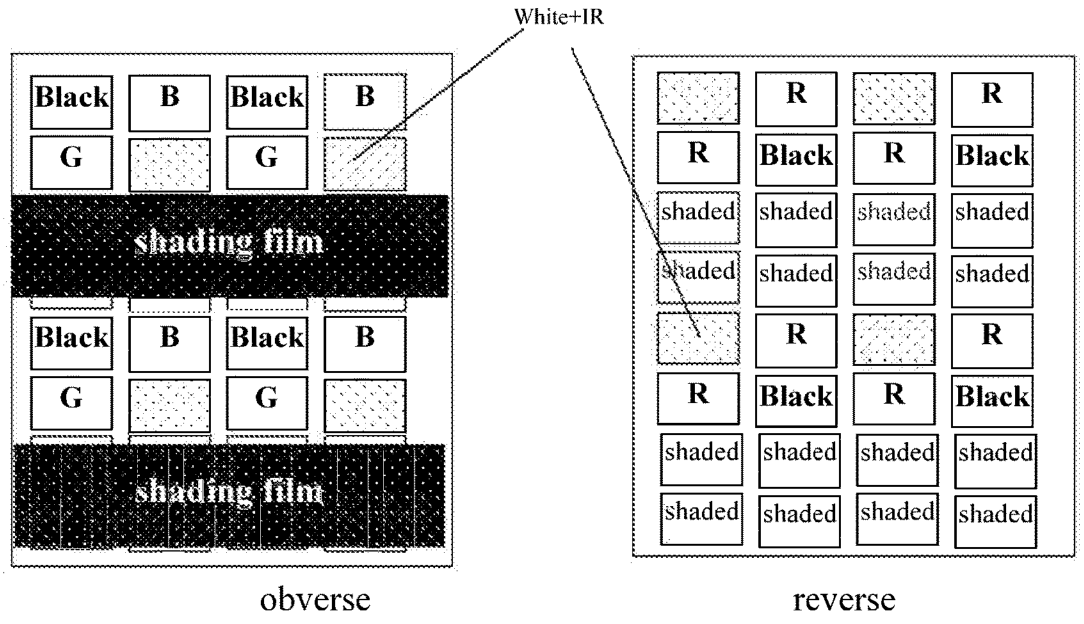
Figure 27:
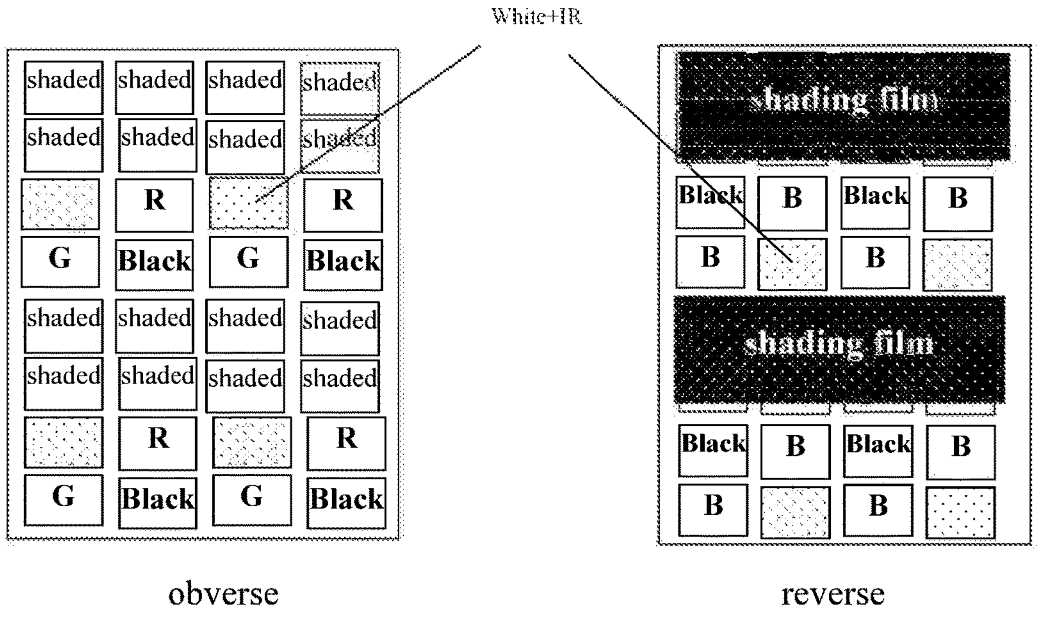

FIGS. 27(*a*) and 27(*b*) are similar to the FIGS. 26(*a*) and (*b*)), but the pattern of the films is coated in every two lines instead of every three lines, correspondingly, the arrangement of the pixels without coated with films is also adjusted. The pixels without the films may be arranged in various patterns, and the drawings herein are merely one of the preferred patterns.

Figure 28:
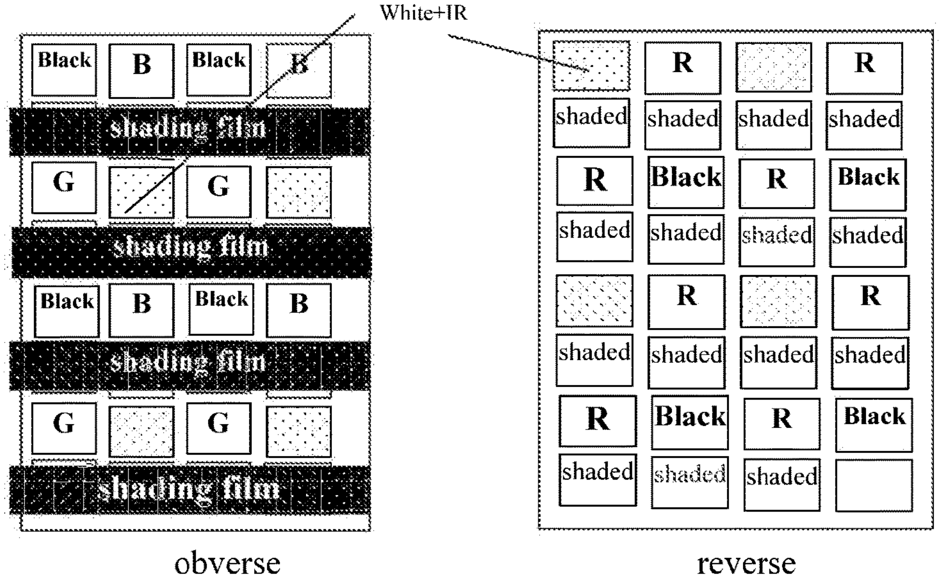
Figure 28:
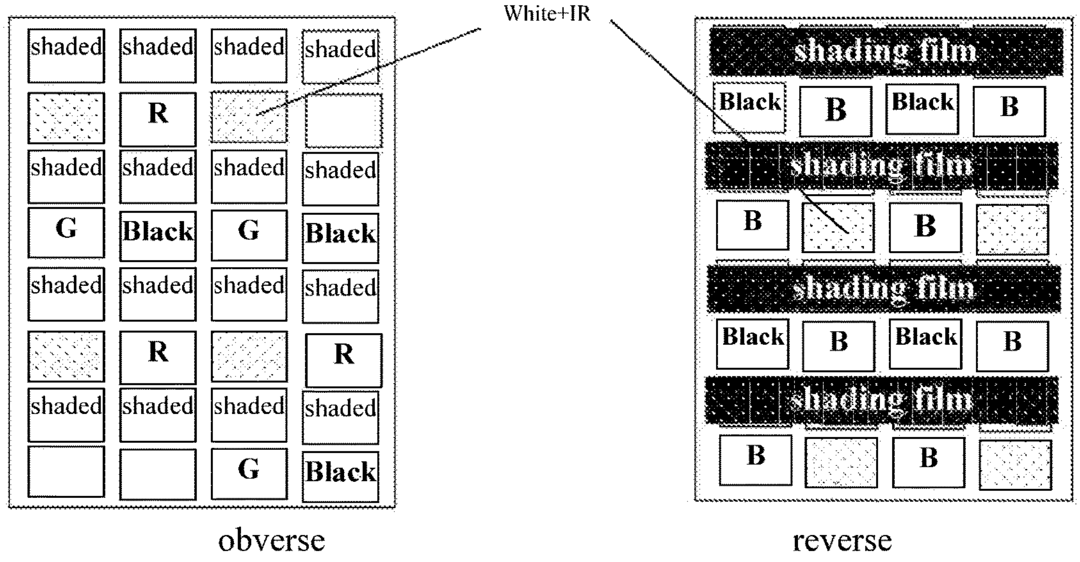

FIGS. 28(*a*) and 28(*b*) are similar to the FIGS. 26(*a*) and (*b*)), but the pattern of the films is coated in every three rows instead of every three columns, correspondingly, the arrangement of the pixels without coated with film is also adjusted. The pixels without the films may be arranged in various patterns, and the drawings herein are merely one of the preferred patterns.

Figure 29:
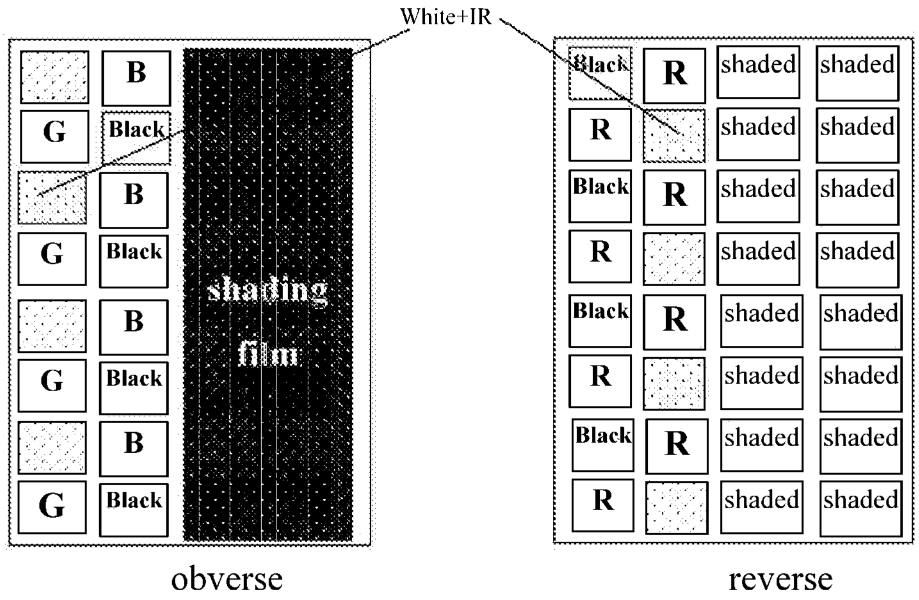
Figure 29:
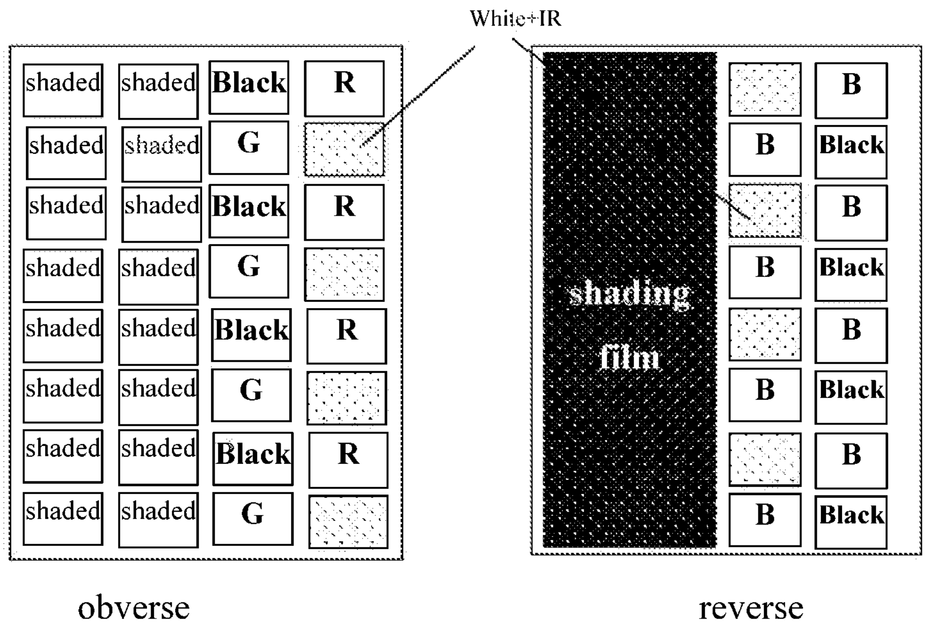

FIGS. 29(*a*) and 29(*b*) are similar to the FIGS. 26(*a*) and (*b*)), but the pattern of the films is coated in every two rows instead of every three columns, correspondingly, the arrangement of the pixels without coated with film is also adjusted. The pixels without the films may be arranged in various patterns, and the drawing herein is merely one of the preferred patterns.

Figure 30:
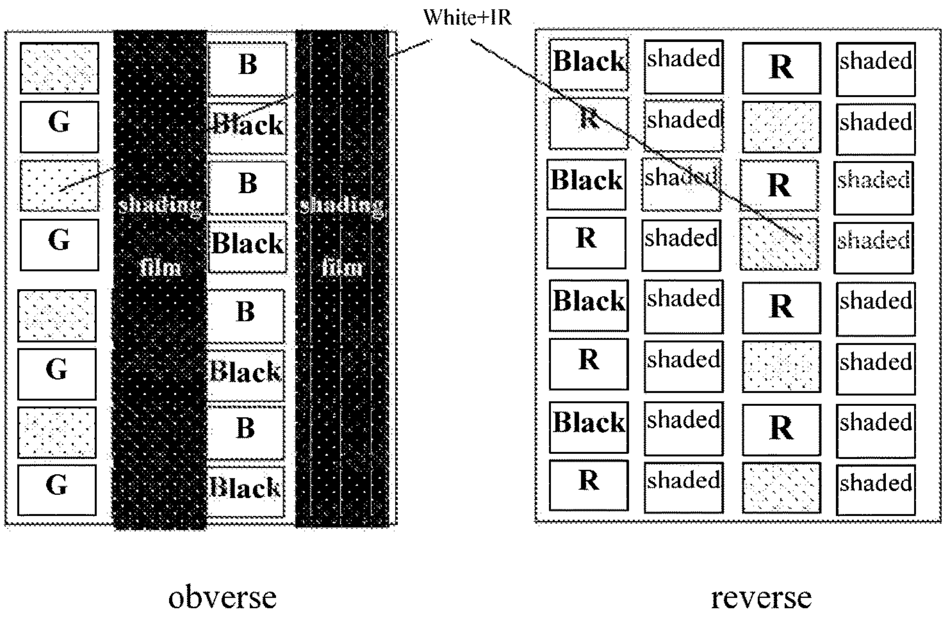
Figure 30:
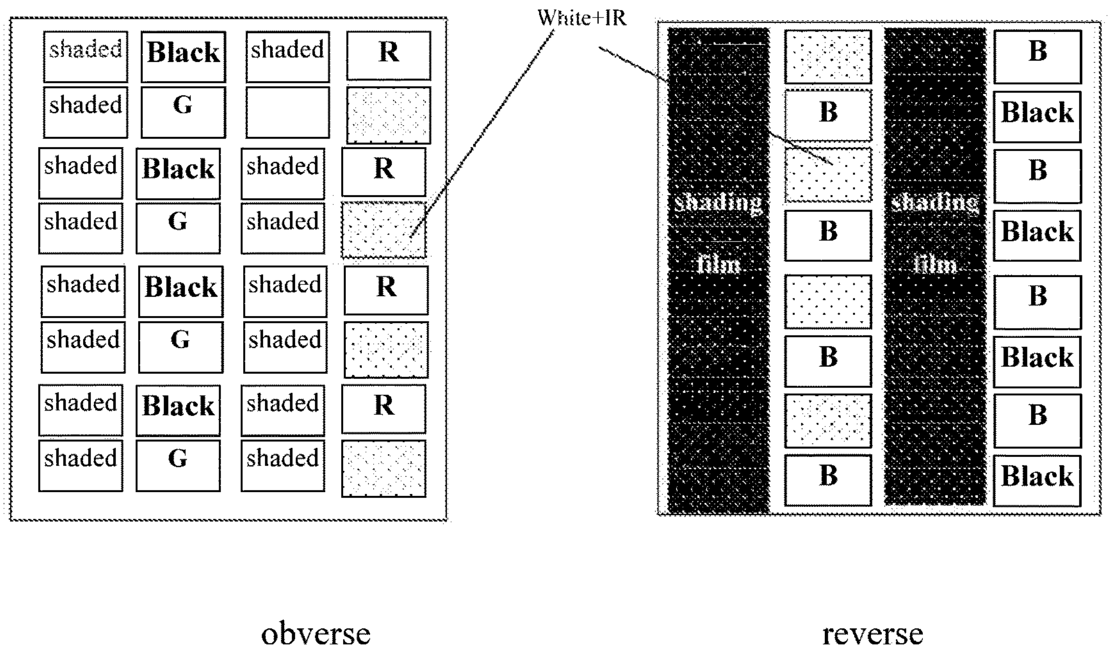

FIGS. 30(*a*) and 30(*b*) illustrate a preferred mode of a film used for a double-direction monochrome sensing chip with the direction-selected-by-pixel pattern sensing white and white plus infrared separately. A higher spatial resolution could be obtained by using the mode. FIGS. 30(*a*) and (*b*) differ from FIGS. 24(*a*) and (*b*) in that, the sensing chips in FIG. 30 can sense the visible light and infrared light separately. The monochrome double-sided double-layer multiple-spectrum sensing chip can also utilize the mode of coated horizontally or vertically as shown in FIGS. 27-29. The figure should not be regarded as a limitation to the method adopting the direction-selected-by-pixel pattern disclosed in the present disclosure.

Figure 31:
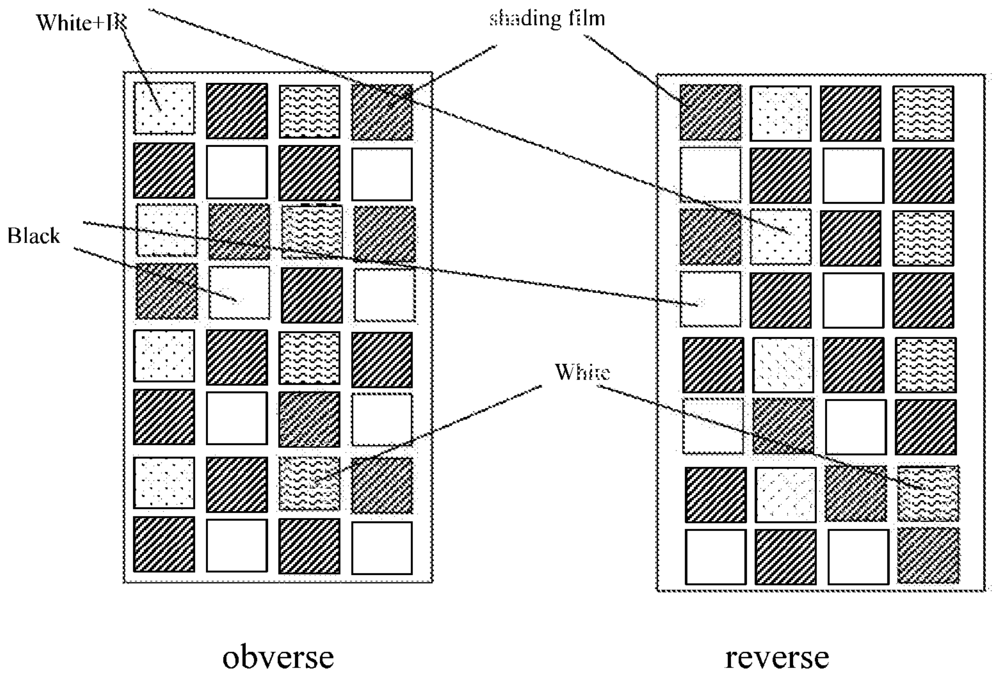

FIG. 31 illustrates a monochrome sensing device with ultrahigh sensitivity using a direction-selected-by-pixel pattern diagonal pattern, which could be used for sensing visible light and infrared light. By coating film in the diagonal pattern shown in FIG. 31, the infrared could be sensed separately in the multiple-spectrum double-direction monochrome sensing chip with high sensitivity as shown in FIG. 24.

Figure 32:
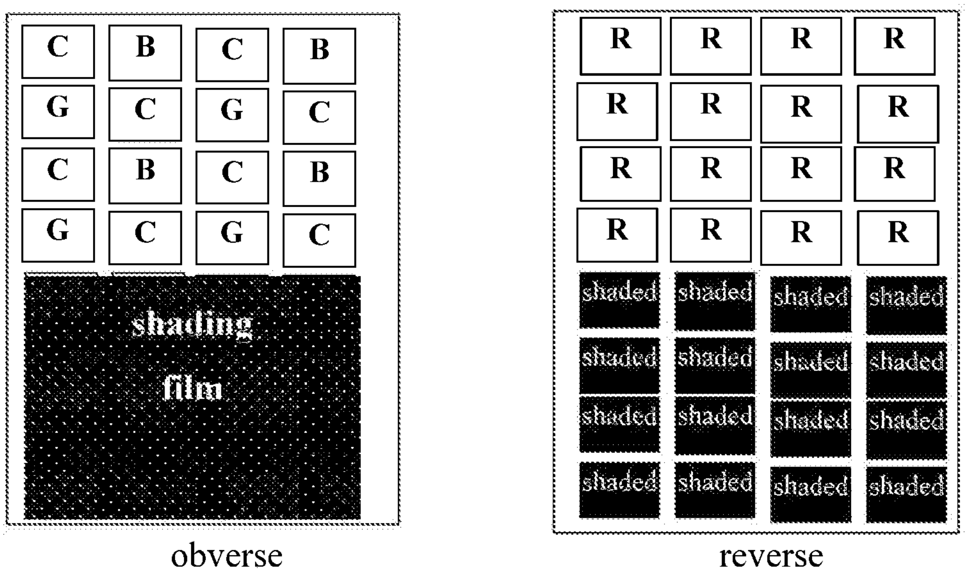
Figure 32:
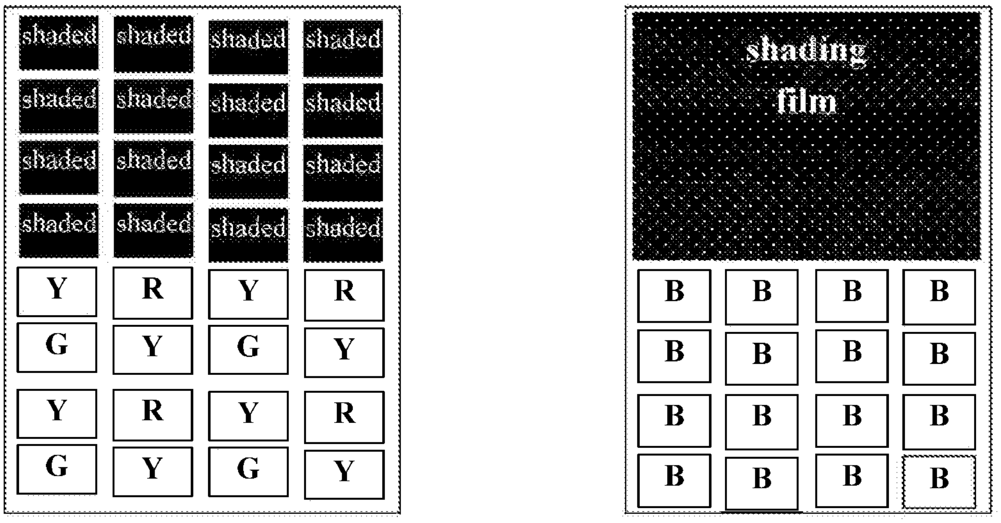

FIG. 32 illustrates a double-sided sensing device adopting the direction-selected-by-area-division pattern to sense from double directions. In such an implement, by using a shading film a pixel area on the obverse could only sense the light from obverse, and a pixel area of the reverse could only sense the light from reverse.

DETAILED DESCRIPTION

The multi-spectrum photosensitive device, manufacturing method and sensing system disclosed herein provides a base layer having one or more sides with photosensitive pixel groups on each side, so that views from different directions could be sensed simultaneously. It should be known that, the shape of a base layer is not limited, such as it could be rectangle, disk-shaped, hexahedron, and the like. If the base layer is opaque, its shape has more selections. While the base layer is transparent, its shape is preferred to be two-sided thin rectangle or hexahedron so as to facilitate obtaining the location of the corresponding pixels on the opposite sides.

Hereinafter is given an example according to the present disclosure. In the example, the base layer is a plane body (i.e., a cuboid with extremely-thin thickness); the photosensitive way of the photosensitive device is double-sided sensing way, i.e. obverse sensing of the base layer and reverse sensing of the base layer. A simple method of for manufacturing a photosensitive chip with multi-spectrum photosensitive pixels sensing double sides simultaneously in the present disclosure is to provide both sides of the base layer, the obverse and the reverse, with photosensitive pixel groups for sensing light from the corresponding direction (outer surface), wherein a photosensitive pixel group comprises at least one pixel. As shown in FIG. 6, the base layer is opaque, thus light from two sides are non-interference. The double-sided sensing chip implemented in such a way equates with a single-layer sensing chip viewing from the obverse direction and the reverse direction of the base layer. We call this kind of sensing chip a composite double-sided sensing chip. FIG. 7 illustrates a diagram of a double-sided double-layer sensing chip implemented by using CYMG pattern. The photosensitive chip is equivalent to an integration of two single-layer sensing chips. However, each single-layer sensing chip has its own processing circuit; and when implementing a system, each photosensitive chip needs its wiring to connect to the signal process unit of the system. As to the photosensitive chip according to the present disclosure, the physical entity is actually a device with only one set of related circuits inside, such as photo-electricity conversion circuit as well as one set of wiring outside. It is not only more economically saving than the integration of two single-layer sensing chip, but also more spatially saving, and more adaptive to the trend of miniaturization and functional diversification of the current digital products. The obverse and the reverse of the composite double-sided sensing chip could use different color and pixel arrangements, that is to say the sensing pixels of the obverse and the reverse have the same or different distributions and respectively sense the same or different spectrum. FIG. 8 shows that when the obverse uses a honeycomb pattern of RGB colors (FIG. 8(*a*)), the reverse could use a Bayer pattern of RGB colors (FIG. 8(*b*)), or a honeycomb pattern of RGB colors (FIG. 8(*c*)), or a CYMG pattern. Herein is given a simple example, which should not be regarded as a limitation to the disclosure.

A diagram of a double-direction sensing system made by a composite double-sided sensing chip is shown in FIG. 17. The system physically integrated is simple, and can pioneer new application. But for a composite double-sided sensing chip, the light from the obverse fails to irradiate the reverse, and vice verse. Therefore it cannot sufficiently exert the advantage of double-layer sensing chip.

A technical solution of transmissive double-sided sensing chip which is slightly complex but much better is as follows:

First of all, a base layer which is transparent or almost transparent (such as a super-thin silicon N-type or P-type layer) is taken as a layer line of a double-layer sensing chip sensing specific spectrums. The base layer is divided into an obverse and a reverse, wherein the obverse is provided with photosensitive pixels sensing a first group of colors, while the reverse is provided with photosensitive pixels sensing a second group of colors.

The spectrums include a combination of the spectrum of blue, green, red, and infrared. The first group of colors sensed on the obverse is selected from no more than four colors that comprise blank color, blue, green, cyan, white, and white plus infrared.

A color layer line is provided for delaminating the photosensitive pixels, such that colors sensed in the observe are above the layer line and colors sensed in the reverse are below the layer line when irradiated from the obverse (which will be described in detail hereinafter in conjunction with FIG. 4(*b*)). As shown in FIG. 4(*b*), the color layer line is a color separation line between blue and green (the first layer line), or between the green and red (the second layer line), or between red and infrared (the third layer line), or a boundary line of maximum wavelength of interest within infrared light (the fourth layer line).

Furthermore, the wavelength of a color sensed on the reverse is longer than the wavelength of a color sensed at the corresponding position on the obverse, and the pixels on the reverse have a corresponding relationship on position with the pixels on the obverse, but the patterns adopted may be different. A spectrum of each color sensed on the reverse is orthogonal to total spectra of colors sensed at corresponding positions on the obverse within a color space of visible light (or visible light plus infrared light). The definition of the term "two colors being orthogonal" means the two colors has no overlapped spectral bands (in theory).

Further, the spectrum of each color sensed on the reverse is complementary to total spectra of colors sensed at corresponding positions on the obverse within a spectral space of visible light (or visible light plus infrared light). The definition of the term "two colors being complementary within a certain spectrum (such as visible light, or visible light plus infrared light)" means the spectrums of two orthogonal colors are added up to form the entire spectral space of interest (i.e. visible light, or visible light plus infrared light).

Further, when irradiated from the obverse, the second group of colors sensed on the reverse includes at most four colors selected from blank color, green, red, yellow, white, infrared, red plus infrared, yellow plus infrared, and white plus infrared.

The pixels sensing colors are disposed in a uniform pattern (in which all the pixels have the same color), horizontal pattern (pattern pixels on the same horizontal line have the same color), vertical pattern (in which pixels on the same vertical line have the same), diagonal pattern (in which diagonal pixels have the same color), generalized Bayer pattern (in which pixels on one diagonal have the same color while pixels on the other diagonal have different colors), YUV422 pattern, horizontal YUV422 pattern, honeycomb pattern, or equal-spacing pattern (in which four pixels are arranged in uniform interlaced with equal space). Some part of the mentioned patterns will be explained in detail later, and the other part will be found in related literature or the earlier application for an invention of the present inventor titled "Multi-spectrum Photosensitive Device and the Manufacturing Method Thereof" (PCT/CN2007/071262).

The obverse could also include a first group of photosensitive pixels sensing intensity of visible light (white color), and the reverse could also include a second group of photosensitive pixels sensing photosensitive infrared and visible light (white+infrared). Such a method is generally used in monochrome sensing devices.

There are multiple methods for making the aforesaid transmissive double-sided photosensitive device, two of which are respectively showed in FIGS. 9 and 10. FIGS. 11 and 12 are examples using a honeycomb pattern.

Pixels of the obverse and the reverse of the sensing chip could have symmetry on direction. Herein, the sensing chip is called as a double-direction symmetrical sensing chip. The double-direction symmetrical sensing chip could sense lights from the obverse and the reverse, and furthermore, with respect to a fixed irradiation direction, the same color could be obtained by turning over the chip. With respect to a symmetrical sensing chip, the obverse and the reverse could be interchanged. That is to say, if the chip is turned over, the characteristics of the obverse and the reverse above-mentioned remain. The symmetry character is a sufficient condition for a double-direction sensing chip. With respect to the design of sensing chip which merely receives light from one direction, the obverse must face to the light source; otherwise the chip could not work normally. Such kind of single-direction sensing chip may be more superior, to the double-direction sensing chip satisfying with symmetry character when sensing light from one side. However the double-direction sensing chip could observe views of two directions.

FIGS. 11 and 12 show another example of a symmetrical color sensing chip adopting honeycomb pattern. FIGS. 14 and 15 show an example of a symmetrical multi-spectrum sensing chip sensing white color and infrared light.

One characteristic of the symmetrical sensing chip adopting orthogonal color layer line is that, when the direction of light source is changed, green remains, red and blue interchanges, yellow and cyan interchanges, and blank color and white (or white plus infrared) interchanges. The principle therein is that: generally, the ability of absorption spectrum for a sensing pixel is correlated with its thickness. Illustrated by the example of blue, green and red, the wavelengths of the three colors are respectively $\lambda 1$, $\lambda 2$, $\lambda 3$, and $\lambda 1<\lambda 2<\lambda 3$. When light irradiated from the obverse, if the thickness of the sensing pixel at a certain position on the obverse of the chip is enough to enable the pixel to absorb the light with wavelength of $\lambda 1$, thus the pixel shows blue; if the thickness of the corresponding sensing pixel at the same position on the reverse of the chip is enough to enable the pixel to absorb the light with wavelength of $\lambda 2$ and $\lambda 3$, thus the corresponding pixel shows green+red=yellow; Contrariwise, when the light irradiated from the reverse, the sensing pixel on the reverse herein absorbs light irradiated of λ2 and λ3, thus it shows blue+green=cyan, while the sensing pixel on the obverse absorbs light with wavelength of λ3, thus showing red. That is to say, spectra sensed by pixel on any side of a symmetrical sensing chip are different when irradiated from the obverse and the reverse, thus obtaining different colors.

When a symmetrical double-direction sensing chip is used for sensing light from two distinct directions of different views, obviously, light from different directions cannot be sensed by an identical pixel simultaneously, otherwise the image will be confused. There are at least two methods for applying the transmissive double-sided sensing chip to sense light from directions of different views.

A first preferred embodiment of the double-direction sensing chip sensing lights from two directions of different views adopts a direction-selected-by-timesharing pattern. In this embodiment, synchronized mechanical shutters are respectively installed behind the lens located at both obverse and reverse. By adopting the direction-selected-by-timesharing pattern –, that is the shutter at the obverse or the reverse is turned on, while at the same time, the other shutter at the reverse or the obverse is turned off, such that the symmetrical double-direction sensing chip can only receive light from the obverse within a time span (e.g. odd time span), and receive light from the reverse within another time span (e.g. even time span). A double-direction imaging system using the direction-selected-by-timesharing pattern is shown as in FIG. 16.

A second preferred embodiment of the double-direction sensing chip sensing lights from two directions of different views adopts a direction-selected-by-pixel pattern. In this embodiment, the pixel array is divided into obverse-sensing group for sensing light from the obverse (e.g. the group includes pixels located on the forward orthogonal, or pixels on the odd rows or columns) and reverse-sensing group for sensing light from the reverse (e.g. the group includes pixels located on the backward orthogonal, or pixels on the even rows or columns). By adopting direction-selected-by-pixel pattern, i.e., shading the reverse-sensing group when sensing at the obverse and shading to the obverse-sensing group when sensing at the reverse, pixels of different groups may sense lights from different directions. With the direction-selected-by-pixel pattern, the spatial resolution might be reduced, and the pattern arranged by colored pixels might be needed to be adjusted to make pixels of obverse-sensing group and reverse-sensing group realize color reconstruction respectively. However, this method does not need mechanical shutters which are needed in the method adopted the direction-selected-by-timesharing, which is more suitable to the applications of limited space. FIG. 17 shows a structural diagram of a double-direction imaging system with double-direction sensing chip adopting the direction-selected-by-pixel pattern. Several preferred embodiments of several double-direction sensing chips adopting several methods with direction-selected-by-pixel pattern will be described below.

A third preferred embodiment of the double-direction sensing chip sensing lights from two directions of different views adopts a simple way, i.e., direction-selected-by-area-division, as shown in FIG. 32.

The multi-spectrum sensing disclosed herein may be used to sense four continuous spectral bands containing a spectrum of red, a spectrum of green, a spectrum of blue and a spectrum of infrared. Here, the infrared will also be called as a basic color. In many applications, the infrared could be neglected. Besides, the photosensitive device operates to sense composite color spectral bands, such as yellow (corresponding to red and green), cyan (corresponding to green and blue) and white (corresponding to red, green and blue).

FIG. 4 illustrates relationship between spectrums and colors of interest, wherein FIG. 4(*a*) illustrates wavelengths of different colors, and FIG. 4(*b*) illustrates the depth of incidence lights with different wavelengths. There are four color layer lines shown in FIG. 4(*b*): a first layer line is boundary between blue and green, a second layer line is boundary between green and red, the third layer line is boundary between red and infrared, and the fourth layer line is boundary of the interested maximum wavelength of infrared. The sensing pixels on each layer may not have the same height or reside in the same depth. However, as shown in FIG. 4(*b*), if there are only colors above a certain layer line in the obverse and there are only colors below the certain layer line in the reverse, the sensing pixels of the obverse and the reverse are able to be disposed at the same depth. The advantage of implementing the color sensing pixels on each side at the same depth is for the ease of manufacturing the sensing device. As shown in FIG. 4(*a*), the wavelength of red on the reverse is longer than cyan or blue on the sides that are upper to the reverse, and the wavelength of yellow is longer than blue, whereas the sensing pixels sensing white reside on the reverse has to be hollow or transparent. With a common green spectrum, sensing pixels sensing yellow and those sensing cyan cannot be disposed at the same position (at different sides).

Blank color (transparent or completely empty color) is realized on the obverse (or a side regarded as the obverse). The panchromatic spectrum (white or white plus infrared) is realized on the reverse (or a side regarded as the reverse). Consequently, the blank color is always above a layer line, and the full color is always below a layer line.

In order to simplify the description to the present disclosure, two terms are introduced herein: complementary color and orthogonal color. To this purpose, we will also call blank color (transparent or completely empty color) as a basic color, which complements to a full color. The full color in the present disclosure means white for the visible light spectra, and white plus infrared for the composite spectra of infrared and visible light.

Within a spectral space of interest (such as visible light spectrums, or a combination spectrums of visible light and infrared), if the two colors have no overlapped spectral bands, they are called orthogonal colors, e.g. red, green and blue colors are orthogonal to each other. In addition, blue is orthogonal to yellow, and cyan is orthogonal to red. Similarly, infrared is orthogonal to the entire visible light. That is, infrared is orthogonal to each of the colors of visible light, including primary colors, complementary colors and white color (luminance intensity).

Within a spectral space of interest (such as visible spectrums, or a combination spectrums of visible light and infrared), if the spectra of two orthogonal colors are added up to form the entire spectral space of interest, the two orthogonal colors are called complementary colors. For example, for the visible light spectrum, cyan is complementary with red, and blue is complementary with yellow. Similarly, for the combined spectrums of infrared and visible light, infrared complementary with white, and red plus infrared and cyan are mutually complementary with cyan, and so on.

FIG. 5 provides examples of some orthogonal or complementary color pairs in the visible light space or in the composite spectral space of visible light and infrared, wherein, FIG. 5(*a*) provides examples of the complementary and orthogonal color pairs in the spectral space of visible light, and FIG. 5(*b*) shows examples of the orthogonal color pairs in the spectral space of infrared and visible light. These orthogonal or complementary color pairs are used in a two-layer sensing device.

Once a layer line is determined, colors sensed by the sensing pixels on the obverse should be above the determined layer line, while colors sensed by the sensing pixels on the reverse must be orthogonal to, and, based on the principle of energy maximization, complementary with the colors at the corresponding positions on the obverse. All the colors sensed by the sensing pixel on the reverse do not have to lie below the layer line. However, if the colors sensed by the sensing pixels on the reverse are all below the layer line, the manufacture of the device will be much easier. Generally, each layer should not comprise more than four distinct colors so as to obtain higher spatial resolution.

Different sensing pixels on the same side are arranged in accordance with excellent patterns for attaining higher spatial resolution. Those excellent patterns include but are not limited to generalized Bayer Pattern (as shown in FIG. 9(*b*)), YUV442 pattern (YUYV arrangement), and Honeycomb pattern (as shown in FIG. 3(*a*) and FIG. 3(*b*)).

The present disclosure mainly considers a sensing device in which pixels are arranged in rectangular or honeycomb patterns. The pixels in the rectangular pattern could be grouped into four-pixel macro-pixels, each of which consists of four pixels in a group, or grouped into eight-pixel macro-pixels, each of which consists of eight pixels in a group, while the pixels in honeycomb pattern could be decomposed into three-pixel macro-pixels, each of which consists of three pixels in a group. The macro-pixel is such a minimum pixel group which can be simply duplicated to form the entire pixel array, and generally consists of adjacent pixels. For rectangular patterns, the macro-pixel could also comprise more than eight pixels. As for a two-layer sensing device, the cost of the macro-pixel having more than eight pixels is much higher, but with few advantages.

The four-pixel macro-pixel in a single layer may comprise one, two, three or four distinct colors. If a four-pixel macro-pixel comprises only one color, there is only one ordering pattern for the pixels, i.e. a uniform pattern. If a four-pixel macro-pixel comprises two distinct colors, there are three types of ordering patterns, i.e., diagonal pattern (in which diagonal pixels have the same color), vertical pattern (in which pixels on the same vertical line have the same color), and horizontal pattern (in which pixels on the same horizontal line have the same color). If a four-pixel macro-pixel comprises three distinct colors, there are many options of the ordering patterns, all of which could be classified as the generalized Bayer order (in which the two same colors are aligned diagonally), YUV422 order (in which the two same colors are aligned vertically), horizontal YUV422 order (in which the two same colors are aligned horizontally). If a four-pixel macro-pixel comprises four distinct colors, all of the ordering patterns for the pixels therein are uniformed, because the patterns are always symmetric. In a preferred embodiment of the present disclosure, for an eight-pixel macro-pixel, the four pixels at the back are implemented by duplicating the four pixels located at the front in accordance with mirror symmetry The three-pixel macro pixel in a single layer may comprise one, two, or three different colors, leading to a total of thirteen options. The honeycomb pattern itself may have two alignments, favoring either a vertical resolution (such as FIG. 3(*a*)) or a horizontal resolution (such as FIG. 3(*b*)). We shall refer all the patterns of the three-pixel macro-pixel as the honeycomb pattern, irrespective of how many colors the macro-pixel comprises.

FIGS. 6(*a*), (*b*), (*c*) respectively provides a preferred embodiment of a double-sided double-layer color sensing device in a Bayer pattern, wherein the obverse comprises pixels sensing red, green and blue color in a Bayer pattern, and the reverse is identical to the obverse in color and pattern. The base layer located at the middle is opaque, so that the sensing pixels of the obverse can merely sense light from the obverse while the sensing pixels of the reverse can merely sense light from the reverse.

FIGS. 7(*a*), (*b*), (*c*) respectively show a preferred embodiment of a double-sided double-layer color sensing device in a CYMG uniform pattern, wherein the obverse comprises pixels sensing cyan, yellow, peach and green in uniform pattern, while the reverse is identical to the obverse in color and pattern. The base layer located at the middle is opaque, so that the sensing pixels of the obverse can merely sense light from the obverse while the sensing pixels of the reverse can merely sense light from the reverse.

The advantage of embodiment for opaque base layer is simple and feasible, which is equivalent to an integration of two normal sensing chips with Bayer pattern.

FIGS. 8(*a*), (*b*), (*c*) and (*d*) aim to explain that with respect to a double-sided double-layer sensing device with an opaque base layer, wherein the obverse and the reverse is entirely capable of adopting different colors and arranging modes. For example, FIG. 8(*a*) illustrates an obverse with RGB honeycomb pattern, but the reverse thereof capable of using either RGB Bayer Pattern shown in FIG. 8(*b*), or RGB honeycomb pattern shown in FIG. 8(*c*), or CYMG uniform pattern as shown in FIG. 8(*d*). Of course, more pattern and color matches are possible.

The double-sided double-layer sensing device with an opaque base layer could be used in a double-direction sensing system. A preferred embodiment of a double-direction sensing system adopting color sensing chips with opaque base layer as shown in FIGS. 6-8 is illustrated in FIG. 17. Because of the opaque base layer, both sides of the sensing chip can simultaneously accept light from the obverse and the reverse. The obverse of the sensing chip obtains views of the obverse, while the reverse of the sensing chip obtains views of the reverse. Such a direction-selecting mode (with an opaque base layer) is called as direction-selected-by-isolation.

Hereinafter, referring to FIG. 8, is given an example to conclude the method of manufacturing a double-sided double-layer color multi-spectrum sensing device with an opaque base layer and a corresponding double-direction sensing system thereof according to the present disclosure.

An opaque base layer is provided, wherein on the obverse of the base layer, a color multi-spectrum sensing device is produced in accordance with a first group of color pattern (such as Bayer Pattern, honeycomb pattern, CYMG pattern, and so on); the selected colors and patterns are determined by application without limited.

The reverse of the base layer is provided with sensing pixels sensing a second group of colors, and a color multi-spectrum sensing device is produced in accordance with a second group of color pattern (such as Bayer Pattern, honeycomb pattern, CYMG pattern, and so on); the selected colors and patterns are determined by application without limited, which could be completely different from the obverse.

A set of lens is installed respectively on both sides of the color multi-spectrum sensing device; wherein shutter installed in the device is mainly for exposure control.

In a preferred embodiment shown in FIG. 9, the base layer is transparent, and the obverses is provided with pixels sensing blue, green and cyan respectively. Since the energy spectrum of cyan is relatively wider, the number of pixels sensing cyan will be larger relatively, as the diagonal shown in FIG. 9(*b*). The reverse contains sensing pixels for sensing red, or red plus infrared spectrum.

A color layer line is provided (see description about FIG. 4(*b*)) for delaminating the sensing pixels, such that colors sensed on the obverse are above the layer line, and colors sensed on the reverse are below the layer line. The color layer line is a color separation line between blue and green (the first layer line), or between green and red (the second layer line), or between red and infrared color (the third layer line), or a boundary line of maximum wavelength of interest within infrared light (the fourth layer line). The color layer line shown in FIG. 9(*a*) is a boundary between red and green.

Furthermore, the pixels sensing color on the obverse are disposed in a uniform pattern, horizontal pattern, vertical pattern, diagonal pattern, generalized Bayer pattern, YUV422 pattern, horizontal YUV422 pattern, honeycomb pattern or equal-spacing pattern. The wavelength of each color sensed on the obverse is longer than the wavelength of the color sensed on the corresponding position of the reverse. FIG. 9(*b*) illustrates a generalized Bayer pattern.

Furthermore, each color sensed on the reverse is orthogonal to color sensed at the corresponding position on the obverse within a color space of visible light or visible and infrared light. Further and preferably, each color sensed on the reverse is complementary to color sensed at the corresponding position on the obverse within a color space of visible light or visible and infrared light.

In a preferred embodiment shown in FIG. 10, the base layer is transparent, and the obverse thereof is provided with pixels sensing blue, while the reverse comprises sensing pixels for sensing green, red and yellow. Yellow, with a relatively wider energy spectrum, may be sensed by a relatively more pixels, such as the diagonal shown in FIG. 10(*a*). The color layer line in FIG. 10(*a*) is a boundary between blue and green. It is noticed that, in this figure, the obverse is drawn at the bottom, aiming at indicating that the obverse and reverse are totally determined by the selection of (light) direction.

Furthermore, the pixels sensing color on the reverse are disposed in a uniform pattern, horizontal pattern, vertical pattern, diagonal pattern, generalized Bayer pattern, YUV422 pattern, horizontal YUV422 pattern, honeycomb pattern or equal-spacing pattern. The wavelength of each color sensed on the reverse is longer than the wavelength of a color sensed on the corresponding position of the obverse. FIG. 10 illustrates a generalized Bayer pattern.

Furthermore, each color sensed on the reverse is orthogonal to color sensed at the corresponding position on the obverse within a color space of visible light or visible and infrared light. Further and preferably, each color sensed on the reverse is complementary to color sensed at the corresponding position of the obverse within a color space of the visible light or visible and infrared light.

The difference between FIG. 10 and FIG. 9 mainly lies in selection of layer line. Such a difference results in symmetry on direction between the sensing device in FIG. 10 and the sensing device in FIG. 9. FIGS. 9 and 10 illustrate an example of the aforementioned double-direction symmetrical sensing chip. If light comes from the obverse in FIG. 9, FIG. 9 illustrates an example of light being sensed on the obverse of the sensing chip, while FIG. 10 illustrates an example of light being sensed on the reverse of the sensing chip. Conversely, if light comes from the obverse in FIG. 10, FIG. 10 illustrates an example of light being sensed on the obverse of the sensing chip, while FIG. 9 illustrates an example of light being sensed on the reverse of the sensing chip. That is to say, FIGS. 9 and 10 illustrate color obtained by the same sensing chip from obverse and from reverse.

Another kind of a double-sided double-layer color multi-spectrum sensing device, as shown in FIGS. 13(*a*), (*b*), (*c*) and (*d*), could sense visible light and infrared light simultaneously. In the figures, pixels sensing infrared are always on the reverse (the back side of the chip), which can be either alone or integrated with those sensing another color (such as white plus infrared or red plus infrared). The obverse (the front side of the chip) contains pixels sensing blue, and pixels at each position of the reverse are those sensing colors orthogonal to blue, such as green, yellow and red plus infrared. A preferred embodiment is an example to integrate a color sensing device with an infrared sensing device. In order to obtain higher spatial resolution within a color space of red plus infrared, pixels sensing red plus infrared are disposed on a diagonal of the reverse. The colors sensed by pixels on the obverse is orthogonal to the colors sensed by pixels at corresponding positions on the reverse within the visible light plus infrared spectrum.

Another kind of a double-sided double-layer color multi-spectrum sensing device is shown in FIGS. 14(*a*) and (*b*). FIG. 14 illustrates a more complex preferred embodiment. In this embodiment, although white comprises a spectral band above the layer line, white color can be implemented on the reverse because the corresponding color is blank color or transparent, as mentioned previously. In such an implementation, color, white color, and infrared are simultaneously sensed. FIG. 14(*a*) illustrates color layer, FIG. 14(*b*) illustrates that the obverse contains pixels sensing blank color (transparent), green, blue (or cyan) and white (or white plus infrared) on the obverse, and FIG. 14(*c*) illustrates pixels sensing blank color, red (red plus infrared) and white (or white plus infrared) on the reverse. The colors sensed by pixels on the obverse is orthogonal to the colors sensed by pixels at corresponding positions on the reverse within the visible light plus infrared spectrum.

FIG. 15 illustrates the options when the sensing chip shown in FIG. 14 is used for sensing on the reverse.

FIGS. 9 and 10 actually illustrate color sensed by a double-direction symmetrical sensing chip irradiated from the obverse and the reverse. A preferred embodiment shown in FIGS. 11 and 12 are the same as that in FIGS. 9 and 10, merely adopting a RGB honeycomb pattern, and forming a double-direction symmetrical sensing chip. The sensing chip shown in FIGS. 14 and 15 are bidirectional symmetrical within the visible light and infrared spectrum. A common characteristic for those bidirectional symmetrical sensing chips is transparent base layer without the direction-selected-by-pixel pattern. This kind of sensing chip is utilizable for receiving light from one direction merely, or from double directions.

When a double-direction sensing chip with transparent base layer which does not have the direction-selected-by-pixel pattern is used for sensing from double directions, and light from two directions will be sensed by the sensing pixels simultaneously on the obverse and the reverse, thereby mixing the views of the obverse and the reverse. A preferred implementing method of isolating views of the obverse and the reverse is to use a system of synchronous dual shutters as shown in FIG. 16. The shutter on the obverse and the shutter on the reverse are always in a state one turned off while the other turned on, such that during any time span, the sensing ship can only obtain the light either on the obverse or on the reverse, instead of obtaining simultaneously. Such a method is called direction-selected-by-time-sharing, i.e. we can obtain views from different directions on the same double-direction sensing chip during different time spans by swiftly switch synchronous dual shutters.

Hereinafter, referring to FIG. 13, is given an example to conclude a preferred method of manufacturing a double-sided double-layer color multi-spectrum sensing device with transparent base layer and a corresponding double-direction sensing system thereof.

A transparent base layer is provided, wherein the colors sensed by pixels on the obverse of the base layer comprise no more than four kinds of colors (the first group of colors) from blank color, blue, green, cyan and white, and a color multi-spectrum sensing device is produced in accordance with a selected color pattern (such as Bayer Pattern or generalized Bayer Pattern, honeycomb pattern, CYMG pattern, YUV422 pattern, and so on).

The color layer line is provided (as shown in FIG. 4(*b*)) for delaminating the sensing pixels, such that colors, except blank color, sensed on the obverse are above the layer line, while colors sensed on the reverse are below the layer line, and the wavelength of each color below the layer line is longer than that of the color above the layer line.

The sensing pixels for sensing a second group of colors are provided on the reverse of the base layer, wherein the sensing pixels on the obverse have an overlap corresponding relationship on position with the pixels on the obverse; a spectrum of each color sensed on the reverse is orthogonal to or complementary to the colors sensed at the corresponding positions on the obverse within a spectral space of visible light or visible light plus infrared. Further, the colors sensed by sensing pixels on the reverse comprises at most four kinds of colors selected from blank color, green, red, yellow, white, infrared, red plus infrared, yellow plus infrared and white plus infrared.

If the sensing device is used for sensing lights from double directions, the direction-select-by-time-sharing mode as shown in FIG. 16 will be preferably used for view isolation from the obverse and the reverse. The sensing device can surely be used for sensing light from one direction.

Another method of implementing photosensitivity is the direction-selected-by-pixel mode. The following describes several preferred embodiments.

FIG. 18 illustrates the patterns adopted in a symmetrical double-sided double-layer sensing chip with a double-direction sensing chip using the direction-selected-by-pixel mode. FIG. 18(*a*) illustrates the sensing chip irradiated by the light on the obverse, and FIG. 18(*b*) illustrates the sensing chip irradiated by the light on the reverse. If the pixels on backward diagonal of the obverse are shaded by a shading film, as shown in FIG. 19(*a*), and the pixels on the forward diagonal of the reverse are shaded by a shading film, as shown in FIG. 19(*b*), we can obtain a double-direction sensing chip with direction-selected-by-pixel. In the sensing chip shown in FIG. 19, pixels on forward diagonals of the obverse and the reverse sense all lights from the obverse, while pixels on backward diagonals of the obverse and reverse sense all lights from the reverse, thereby achieving the direction being selected by pixel.

The direction-selected-by-pixel mode is realized by shading different pixels of the obverse and the reverse with shading films. The patterns of the shading film could be various. Besides the diagonal pattern shown in FIG. 19, there are also double-lined horizontal pattern as shown in FIG. 20, every-two-line horizontal pattern as shown in FIG. 21, double-row vertical pattern as shown in FIG. 22, every-two-row vertical pattern as shown in FIG. 23. Those patterns, as well as the direction-selected-by-pixel pattern realized by other preferred embodiments later, are merely examples as explaining the spirit of the present disclosure, instead of regarding as all cases and limitations to the present disclosure. When diagonal pattern is adopted, in order to obtain uniformly distributed pixels, the pixels may be duplicated with a group of eight pixels, rather than a group of three or four pixels as in other patterns.

When a double-direction sensing chip with the direction-selected-by-pixel pattern is used for sensing white and infrared, the pattern is more complex. Because multi-spectrum sensing is an important application of the present disclosure, more preferred embodiments will be described below.

FIG. 24 illustrates a double-direction sensing chip with the direction-selected-by-pixel pattern for sensing white and infrared. This sensing chip is used for sensing no color but white or white plus infrared. Such kind of sensing chip could be used in a double-direction sensing system which requires of ultrahigh sensitivity.

FIG. 25 illustrates the patterns adopted in a symmetrical double-sided double-layer sensing chip with a double-direction multi-spectrum sensing chip using the direction-selected-by-pixel mode. The sensing chip is used for sensing colors of red, green, blue, blank color and white. FIG. 25(*a*) illustrates the ordering of pixels of the obverse and the reverse when the sensing chip irradiated by the light of the obverse. FIG. 25(*b*) illustrates the sensing t of the obverse and the reverse when the sensing chip irradiated by the light of the reverse. If the pixels on the backward diagonal on the obverse are shaded with a shading film, as shown in FIG. 26(*a*), and the pixels on the forward diagonal on the reverse, as shown in FIG. 26(*b*), a double-direction sensing chip with the direction-selected-by-pixel pattern can be obtained. In the sensing chip shown in FIG. 26, pixels on forward diagonals of the obverse and reverse sense all lights from the obverse, while pixels on backward diagonals of the obverse and reverse sense all lights from the reverse, thereby achieving direction being selected by pixel.

Similarly, with respect to the double-direction multi-spectrum sensing chip with the direction-selected-by-pixel pattern sensing white and infrared, besides the diagonal pattern shown in FIG. 26, there are double-lined horizontal pattern shown in FIG. 27, every-two-line horizontal pattern as shown in FIG. 28, double-row vertical pattern as shown in FIG. 29, every-two-row vertical pattern as shown in FIG. 30.

If it is necessary to sense infrared by the monochrome multi-spectrum double-direction sensing chip with high sensitivity as shown in FIG. 24, the diagonal pattern and pixel distribution as shown in FIG. 31 may be adopted. In pixel group which consists of eight pixels on the obverse, the pixels on the backward diagonal are shaded by shading films, and the pixels on forward diagonal comprise a pixel sensing white plus infrared, two pixels sensing blank color, and a pixel sensing white (or infrared). In a pixel group which consists of eight pixels on the reverse, the pixel on the forward diagonal are shaded by shading films, and the pixels on backward diagonal comprise a pixel sensing white plus infrared, two pixels sensing blank color, and a pixel sensing white (or infrared).

Hereinafter, referring to FIG. 30 is given an example to conclude the method of manufacturing a double-sided double-layer color multi-spectrum sensing device with a transparent base layer and the direction-selected-by-pixel pattern, and the corresponding double-direction sensing system thereof according to the present disclosure.

A transparent base layer is provided, wherein the colors sensed by pixels on the obverse of the base layer comprises no more than four kinds of colors (the first group of colors) selected from blank color, blue, green, cyan and white, and a color multi-spectrum sensing device is produced in accordance with a selected color pattern (such as Bayer Pattern or generalized Bayer Pattern, honeycomb pattern, CYMG pattern, YUV422 pattern, and so on).

The color layer line is provided (as shown in FIG. 4(*b*)) for delaminating the sensing pixels, such that colors, except blank color, sensed on the obverse are above the layer line, while the colors sensed on the reverse are below the layer line, and the wavelength of each color below the layer line is longer than that of the color above the layer line.

The sensing pixels for sensing the second group of colors are provided on the reverse of the base layer, wherein the sensing pixels on the obverse have an overlap corresponding relationship on position with the pixels on the obverse; a spectrum of each color sensed on the reverse is orthogonal to or complementary to colors sensed at the corresponding positions on the obverse within a spectral space of visible light or visible light plus infrared. Further, the colors sensed by sensing pixels on the reverse comprises at most four kinds of colors selected from blank color, green, red, yellow, white, infrared, red plus infrared, yellow plus infrared and white plus infrared.

In accordance with a certain preferred pattern, such as diagonal pattern, horizontal every-three-line pattern, horizontal every-two-line pattern, vertical every-three-row pattern, vertical every-two-row pattern as shown in FIGS. 36-30, some pixels on the surface of the obverse is coated or spout with a shading film, and the other pixels on reverse is also coated or spout with a shading film, so that the pixel on the obverse without shading film (on both sides of the obverse and the reverse) can merely sense light on the obverse, and pixels on the reverse without shading film (on both sides of the obverse and the reverse) can merely sense light of the reverse.

The sensing device is mainly used for double direction sensing. Because of the direction-selected-by-pixel pattern, a simple shutter system may be adopted as shown in FIG. 17. The shutter is dispensable.

Those skilled in the art may understand that, the methods for manufacturing entire spectrum color (double-direction or single direction) sensing device illustrated in other figures is identical to or similar to the above, which are not described herein.

Those skilled in the art may also understand that, by changing the color and arrangement of pixels on the obverse (the front side of the chip) and the reverse (the back side of the chip), many implementations different from the above preferred embodiment could be produced.

According to the present disclosure, the color sensing device may be manufacturing by either using shading film or not. However since the shading film can absorb light energy, and part of absorbed light energy is generally converted to thermal noise, the device of the present disclosure is preferably produced without shading film to maximally convert light into electronic signals.

By providing sensing pixels on two or more sides of a base layer of a multi-spectrum sensing device, the present disclosure not only makes an optimization to carry out a double-sided double-layer design from the viewpoint of physical structure, but also simultaneously sense different views of two directions, such that the same device may obtain different views of different directions, which can save the cost of space and economic. With respect to an opaque base layer, the views of two opposite directions are sense on the same sensing chip with the direction-selected-by-isolation pattern. With respect to a transparent base layer, by delicately ordering and configuring pixels on the obverse and the reverse, based on guaranteeing complete color reconstruction, it will maximally use the energy of incident light or maximize a spatial resolution or obtain a larger color representation gamut at a low cost. The views of two opposite directions are sensed simultaneously on the same sensing chip with the direction-selected-by-time-sharing mode or direction-selected-by-pixel mode; when the measure of direction-selecting is not utilized, such as in aerospace, industry and trick photography and the like, the compound of two views are easily realized.

By applications of aforementioned sensing modes such as double sides, double directions, double layers, and the like according to the present disclosure, a single-direction sensing device can be used in a double-direction sensing system, which greatly reduces the system cost, demolishes the size and decrease the system complexity; further, it makes possible for receiving on the same one system the application of multi-spectrum or multiple directions (or multi-spectrum signals from two directions). For example, a current capsule-style camera used for examining a patient's indigestion is provided with a camera lens installed at one end. For the sake of obtaining image of a certain position of the indigestion, it is necessary to photograph for many times, which brings a great pain to the patient as well as huge economic expense. Thus it is necessary to extend the photography range of taking picture for a single time. If another end of the capsule-style camera is provided with a camera, by the current technical measure, it must install two sets of systems in an extremely small space, which is quite difficult on implementation. However by the present disclosure, it merely needs to add a lens on the other end, and the sensing chip thereof still uses one slice, the requirement to the space of which is not high, and the economic cost is lower than the expense of two sets of systems. Furthermore, if the base layer is hexahedron, it can even sense the views of six directions, i.e., up and down, left and right, front and back, simultaneously, greatly enhancing the possibility of obtaining required image for a single time. In addition, according to the present disclosure, two directions of front and hack could be monitored on one monitoring camera, and with respect to many 3G cell phones with two cameras, each in the front and back, the two cameras could be replaced by a double-direction camera, and the switch of the front and back views can be achieved through electronic switch or mechanic switch. As for monitoring system of some high-class hotels, if it is necessary to monitor views of both ends of a corridor, by adopting the present disclosure, only one set of monitoring system can carry out necessary monitoring, and there is no need of two sets of monitoring systems to respectively monitor two directions. Or an example of individual combat equipment in the modern military, generally it is necessary to be provided with night vision monitor system on the helmet. If two directions of front and back are needed to be monitored, it requires two sets of monitoring systems, which is unsuitable for individual combat equipment which requires lightweight. By using the present disclosure, only two lenses are needed, and the sensing system thereof is only one set, which thus saves the economic cost and whole weight of the individual combat equipment.

Although the present disclosure is described through the preferred embodiments, such disclosure should not be considered limitations to the disclosure. For those skilled in the field of image sensing devices (such as semiconductor image sensor chips), upon the disclosure, it is possible to anticipate many variations and extensions of the present invention, without departing from the spirit and concept of the invention.

The invention claimed is:

1. A multi-spectrum photosensitive device, comprising:

a multi-spectrum double-direction photosensitive chip, comprising at least one transparent base layer; wherein:

each base layer comprises two surfaces which are presented back to back, the two surfaces are provided with photosensitive pixel groups thereon in a single layer, each photosensitive pixel group is used for sensing light of interested spectrum irradiated from the obverse direction or reverse direction of the surface the photosensitive pixel group located on, and an irradiation direction of the light sensed by one surface of the two surfaces is opposite to an irradiation direction of the light sensed by another surface of the two surfaces; and a direction-selecting means for, when all or part of pixels on a selected surface are sensing, shading pixels at the same position on the surface symmetrical to the selected surface to prevent shaded pixels to be irradiated.

2. A multi-spectrum photosensitive device according to claim 1, wherein the multi-spectrum double-direction photosensitive chip comprises one base layer provided with two sensing surfaces, the two sensing surfaces respectively comprises photosensitive pixels used for sensing various spectrums, wherein the photosensitive pixels are arranged in a same or different distribution.

3. A multi-spectrum photosensitive device according to claim 1, wherein the interested spectrum comprises one or more spectrums of blue, green, red, cyan, yellow, white, infrared, red plus infrared, yellow plus infrared and white plus infrared spectrum.

4. A multi-spectrum photosensitive device according to claim 1, wherein when irradiated from one direction, spectrum sensed by photosensitive pixels on the reverse is orthogonal to spectrum sensed by photosensitive pixels at the same positions on the obverse.

5. A multi-spectrum photosensitive device according to claim 1, wherein when irradiated from one direction, spectrum sensed by photosensitive pixels on the reverse is complementary to spectrum sensed by photosensitive pixels at the same positions on the obverse.

6. A multi-spectrum photosensitive device according to claim 1, wherein the direction-selecting means is a synchronous multi-shutter system, each shutter therein is arranged in front of each surface of the base layer, and two shutters in a group in front of two surfaces opposite with each other are respectively in an opened state and closed state simultaneously.

7. A multi-spectrum photosensitive device according to claim 1, wherein the direction-selecting means is a shading film coated on part of pixels on each surface of the base layer in accordance with a preset direction-selected-by-pixel pattern, and at most one of two pixels at the same position on the obverse and reverse is coated by the shading film.

8. A multi-spectrum photosensitive device according to claim 7, wherein the direction-selected-by-pixel pattern is selected from a diagonal pattern, an every-three-column horizontal pattern, an every-two-column horizontal pattern, an every-three-row vertical pattern, an every-two-row vertical pattern, and an area-division pattern.

9. A multi-spectrum photosensitive device according to claim 6, wherein pixels on the obverse and the reverse are symmetric on direction.

10. A multi-spectrum photosensitive device according to claim 1, wherein a set of lens are installed respectively in front of each surface of the base layer.

11. A manufacturing method for multi-spectrum photosensitive device according to claim 1, comprising:

providing a multi-spectrum double-direction photosensitive chip, wherein providing the multi-spectrum double-direction photosensitive chip comprises:

providing the at least one transparent base layer, wherein each base layer comprises the two surfaces which are presented back to back;

providing the two surfaces with the photosensitive pixel groups in a single layer, wherein each sensing photosensitive group is used for sensing light of interested spectrum irradiated from obverse direction or reverse direction of the surface the photosensitive pixel groups located on, wherein an irradiation direction of the light sensed by one surface of the two surfaces is opposite to an irradiation direction of the light sensed by another surface of the two surfaces; and further providing a direction-selecting means, the direction-selecting means for, when all or part of pixels on a selected surface are sensing, shading pixels at the same position on the surface symmetrical to the selected surface to prevent shaded pixels to be irradiated.

* * * * *

UNITED STATES PATENT AND TRADEMARK OFFICE

CERTIFICATE OF CORRECTION

PATENT NO. : 10,008,522 B2
APPLICATION NO. : 13/699558
DATED : June 26, 2018
INVENTOR(S) : Xiaoping Hu It is certified that error appears in the above-identified patent and that said Letters Patent is hereby corrected as shown below:

In the Specification

Column 10, Line 37, change "(b))," to --(b),--.

Column 10, Line 44, change "(b))," to --(b),--.

Column 11, Line 37, change "(b))," to --(b),--.

Column 11, Line 44, change "(b))," to --(b),--.

Column 11, Line 51, change "(b))," to --(b),--.

Column 17, Line 62, after "symmetry" insert --.--.

In the Claims

Column 26, Line 26, in Claim 9, change "claim 6," to --claim 1,--.

Signed and Sealed this
Twelfth Day of February, 2019

Andrei Iancu
*Director of the United States Patent and Trademark Office*